(12) United States Patent
Pileggi et al.

(10) Patent No.: US 7,945,868 B2
(45) Date of Patent: May 17, 2011

(54) TUNABLE INTEGRATED CIRCUIT DESIGN FOR NANO-SCALE TECHNOLOGIES

(75) Inventors: Lawrence T. Pileggi, Pittsburgh, PA (US); Xin Li, Pittsburgh, PA (US)

(73) Assignee: Carnegie Mellon University, Pittsburgh, PA (US)

( * ) Notice: Subject to any disclaimer, the term of this patent is extended or adjusted under 35 U.S.C. 154(b) by 419 days.

(21) Appl. No.: 12/243,176

(22) Filed: Oct. 1, 2008

(65) Prior Publication Data

US 2009/0089731 A1    Apr. 2, 2009

Related U.S. Application Data

(60) Provisional application No. 60/976,682, filed on Oct. 1, 2007.

(51) Int. Cl.
*G06F 17/50* (2006.01)
(52) U.S. Cl. .......... 716/30; 716/100; 716/101; 716/104; 716/110; 716/115; 716/132; 716/136; 716/138; 703/2; 703/13; 703/14; 326/26; 326/27; 327/51; 327/52; 327/53; 327/63; 327/66; 327/246
(58) Field of Classification Search .............. 716/30, 716/100–101, 104–110, 115, 132–136, 138; 703/2, 13–22; 326/26–27; 327/51–53, 63, 327/64, 246
See application file for complete search history.

(56) References Cited

U.S. PATENT DOCUMENTS

| | | | |
|---|---|---|---|
| 6,192,508 B1 | 2/2001 | Malik et al. | |
| 6,286,128 B1 | 9/2001 | Pileggi et al. | |
| 6,346,856 B1 * | 2/2002 | Myers et al. | 330/252 |
| 6,367,051 B1 | 4/2002 | Pileggi et al. | |
| 6,385,760 B2 | 5/2002 | Pileggi et al. | |
| 6,442,743 B1 | 8/2002 | Sarrafzadeh et al. | |
| 6,449,756 B1 | 9/2002 | Malik et al. | |
| 6,651,232 B1 | 11/2003 | Pileggi et al. | |
| 6,775,808 B1 | 8/2004 | Raje et al. | |
| 6,820,245 B2 | 11/2004 | Beattie et al. | |
| 6,961,916 B2 | 11/2005 | Sarrafzadeh et al. | |
| 7,096,174 B2 | 8/2006 | Pileggi et al. | |
| 7,278,118 B2 | 10/2007 | Pileggi et al. | |
| 7,325,180 B2 | 1/2008 | Pileggi et al. | |
| 7,350,164 B2 | 3/2008 | Xu et al. | |
| 7,358,809 B2 | 4/2008 | Elder | |
| 2003/0046045 A1 | 3/2003 | Pileggi et al. | |

(Continued)

OTHER PUBLICATIONS

S. Nassif, "Modeling and analysis of manufacturing variations," IEEE CICC, pp. 223-228, 2001.

(Continued)

*Primary Examiner* — Nghia M Doan
(74) *Attorney, Agent, or Firm* — Oppedahl Patent Law Firm LLC

(57) ABSTRACT

The invention discloses a method for tuning nano-scale analog-circuit designs in order to reduce random-device mismatches and optimize said design, where nano-scale devices potentially have large-scale process variations. The method includes providing a tunable circuit topology, wherein each nano-scale device comprises a single component or comprises multiple parallel components. Each component is decomposed into multiple discrete sub-components, wherein each said sub-component either operates in parallel with other like components to effectively operate like one bigger component. The sub-components are subjected to a dynamic-programming process to adaptively select the sub-components to be kept operational, while configuring the nonselected sub-components to be nonoperational, based on the measurement of at least one operational parameter.

47 Claims, 10 Drawing Sheets

U.S. PATENT DOCUMENTS

| | | | |
|---|---|---|---|
| 2005/0021319 A1 | 1/2005 | Li et al. | |
| 2005/0065763 A1 | 3/2005 | Beattie et al. | |
| 2006/0047491 A1 | 3/2006 | Li et al. | |
| 2007/0019447 A1 | 1/2007 | Keskin et al. | |
| 2008/0029753 A1 | 2/2008 | Xu et al. | |
| 2008/0072198 A1 | 3/2008 | Celik et al. | |
| 2008/0098334 A1 | 4/2008 | Pileggi et al. | |
| 2008/0163151 A1 | 7/2008 | Motiani et al. | |
| 2008/0163152 A1 | 7/2008 | Kheterpal et al. | |
| 2008/0218260 A1* | 9/2008 | Quaglietta | 330/126 |

OTHER PUBLICATIONS

Semiconductor Industry Association, International Technology Roadmap for Semiconductors, 2005.

G. Gielen and R. Rutenbar, "Computer-aided design of analog and mixed-signal integrated circuits," Proceedings of the IEEE, vol. 88, No. 12, pp. 1825-1852, Dec. 2000.

G. Debyser and G. Gielen, "Efficient analog circuit synthesis with simultaneous yield and robustness optimization," IEEE ICCAD, pp. 308-311, 1998.

A. Seifi, K. Ponnambalam and J. Vlach, "A unified approach to statistical design centering of integrated circuits with correlated parameters," IEEE Trans. CAS-I, vol. 46, No. 1, pp. 190-196, Jan. 1999.

F. Schenkel, M. Pronath, S. Zizala, R. Schwencker, H. Graeb and K. Antreich, "Mismatch analysis and direct yield optimization by spec-wise linearization and feasibility-guided search," IEEE DAC, pp. 858-863, 2001.

X. Li, P. Gopalakrishnan, Y. Xu and L. Pileggi, "Robust analog/RF circuit design with projection-based performance modeling," IEEE Trans. CAD, vol. 26, No. 1, pp. 2-15, Jan. 2007.

J. Tschanz, J. Kao, S. Narendra, R. Nair, D. Antoniadis, A. Chandrakasan and V. De, "Adaptive body bias for reducing impacts of die-to-die and within-die parameter variations on microprocessor frequency and leakage," IEEE JSSC, vol. 27, No. 11, pp. 1396-1402, Nov. 2002.

T. Chen and S. Naffziger, "Comparison of adaptive body bias (ABB) and adaptive supply voltage (ASV) for improving delay and leakage under the presence of process variation," IEEE Trans. VLSI, vol. 11, No. 5, pp. 888-899, 2003.

M. Mani, A. Singh and M. Orshansky, "Joint design-time and post-silicon minimization of parametric yield loss using adjustable robust optimization," IEEE ICCAD, pp. 19-26, 2006.

P. Kinget, "Device mismatch and tradeoffs in the design of analog circuits," IEEE JSSC, vol. 40, No. 6, pp. 1212-1224, Jun. 2005.

M. Pelgrom, A. Duinmaijer and A. Welbers, "Matching properties of MOS transistors," IEEE JSSC, vol. 24, No. 5, pp. 1433-1440, Oct. 1989.

P. Drennan and C. McAndrew, "Understanding MOSFET mismatch for analog design," IEEE JSSC, vol. 38, No. 3, pp. 450-456, Mar. 2003.

S. Ray and B. Song, "A 13b linear 40 MS/s pipelined ADC with self-configured capacitor matching," IEEE ISSCC, pp. 852-861, 2006.

K. Chan and I. Galton, "A 14b 100 MS/s DAC with fully segmented dynamic element matching," IEEE ISSCC, pp. 2390-2399, 2006.

A. Dharchoudhury and S. Kang, "Worse-case analysis and optimization of VLSI circuit performance," IEEE Trans. CAD, vol. 14, No. 4, pp. 481-492, Apr. 1995.

E. Felt, S. Zanella, C. Guardiani and A. Sangiovanni-Vincentelli, "Hierarchical statistical characterization of mixed-signal circuits using behavioral modeling," IEEE ICCAD, pp. 374-380, 1996.

M. Sengupta, S. Saxena, L. Daldoss, G. Kramer, S. Minehane and J. Chen, "Application-specific worst case corners using response surfaces and statistical models," IEEE Trans. CAD, vol. 24, No. 9, pp. 1372-1380, Sep. 2005.

X. Li, J. Le, P. Gopalakrishnan and L. Pileggi, "Asymptotic probability extraction for nonnormal performance distributions," IEEE Trans. CAD, vol. 26, No. 1, pp. 16-37, Jan. 2007.

M. Mckay, R. Beckman and W. Conover, "A comparison of three methods for selecting values of input variables in the analysis of output from a computer code," Technometrics, vol. 21, No. 2, pp. 239-245, May 1979.

E. Pebesma and G. Heuvelink, "Latin hypercube sampling of Gaussian random fields," Technometrics, vol. 41, No. 4, pp. 303-312, Nov. 1999.

A. Papoulis and S. Pillai, Probability, Random Variables and Stochastic Processes, McGraw-Hill, 2001, pp. 63-73.

B. Razavi, Design of Analog CMOS Integrated Circuits, McGraw, 2001, pp. 100-134.

D. Bertsekas, Dynamic Programming and Optimal Control, Athena Scientific, 2005, pp. 321-350.

* cited by examiner

TUNABLE INTEGRATED CIRCUIT DESIGN FOR NANO-SCALE TECHNOLOGIES

CROSS-REFERENCE TO RELATED APPLICATIONS

This application claims priority from U.S. application No. 60/976,682, filed Oct. 1, 2007, which application is incorporated herein by references for all purposes.

BACKGROUND

1. Background Discussion

NOTE: Some of the references referred in this subsection, using the reference number contained in the square brackets [ ], are listed to in the next subsection.

The continued scaling of CMOS technologies has brought about increasing uncertainties in process parameters to the point for which it is difficult to create reliable, robust design over all process variations. As integrated circuits continue to aggressively scale to smaller feature size (e.g., 65 nm, 45 nm, etc.), it is extremely difficult, if not impossible, to reliably manufacture circuits while achieving high product yield (or equivalently, low manufacturing cost). Traditional robust IC design methodologies (e.g., corner-based design and statistical design) attempt to leave sufficient performance margins to accommodate all process variations using a fixed circuit (i.e., fixed circuit topology and device size). As performance margins are increased, however, achieving high-performance IC design quickly becomes infeasible.

The expectation is that this problem will only worsen for post-CMOS technologies. Therefore, a point has been reached for which a paradigm shift is required to move today's deterministic design to more tunable design based on stochastic technique in order to facilitate high yield and high performance electronic products that are based on less reliable nano-scale devices.

Since manufacturing conditions are unknown during the design phase, they must be statistically modeled as random variables. Most existing robust design approaches attempt to statistically predict the random performance distributions and then add additional performance margins to accommodate the uncertainties.

With the increasingly large magnitude of the process fluctuations, existing robust design strategies attempt to reserve larger performance margins than ever before. As previously stated, such schemes ultimately reach a point for which achieving high-performance design becomes infeasible. For this reason, a new model for the IC design process is required to simultaneously improve circuit performance and product yield when using manufacturing processes that include significant uncertainty.

As integrated circuit (IC) technologies scale to 65 nm and beyond, process variations become increasingly critical and make it continually more challenging to create a reliable, robust design with high yield (see Background reference [1]). Process variations can be classified into two broad categories: inter-die variations and intra-die variations. Inter-die variations model the common/average variations across the die, while intra-die variations model the individual, but spatially correlated, local variations (e.g., random device mismatches) within the same die. Among all sources of variations, the random mismatches due to doping fluctuations are expected to become dominant within the next few technology generations (see Background reference [2]), as shown in FIG. 1. This is easy to anticipate because in today's technology a gate channel may contain only approximately 100 dopant atoms. Such large-scale variations must be carefully considered within today's IC design flow.

During the past two decades, various statistical design methodologies have been proposed for analog circuits (see Background references [3]-[7]). The key idea of these methods is to accurately predict random performance distributions and then leave sufficient performance margins to accommodate large-scale process variations. With scaling of CMOS below 90 nm, the traditional statistical design methodologies attempt to reserve larger performance margins than ever before, thereby making it extremely difficult (or even infeasible) to achieve a high-performance circuit design. For this reason, the idea of post-silicon tuning has been proposed and successfully applied to various applications. For example, adaptive supply voltage and adaptive body bias are two widely-used techniques to reduce delay and leakage variations for digital circuits (see Background references [8]-[10]).

Analog circuits, however, are substantially different in nature. Most analog circuit designs (e.g., differential pair, switched-capacitor amplifier, etc.) are ratio-based (see Background reference [23]); namely, their behaviors depend on the ratio between two analog devices. These analog circuits are designed to be robust to inter-die variations, but they are extremely sensitive to device mismatches. Moreover, analog layouts are based on regular structures, such as concentric layout (see Background reference [23]), which control systematic variations and make random fluctuations the dominant source of mismatch. Therefore, reducing random mismatches for analog devices (not only for transistors but also for resistors, capacitors, etc.) is a top priority for today's analog IC designs (see Background reference [11]).

The traditional approach for reducing random mismatches is to utilize large devices; that is, a larger gate channel contains more dopant atoms, thereby averaging-out random fluctuations. According to the well-known Pelgrom model (see Background references [12]-[13]), the standard deviation of random mismatch is inversely proportional to the square root of the device area: $\sigma_{MISMATCH} \sim 1/\sqrt{Area}$. Namely, if device area is increased by 100×, mismatch is only reduced by 10×. This fundamental limitation prevents analog and RF circuits from further CMOS scaling to achieve smaller area, faster speed and lower power. The challenging problem is how to more effectively reduce random mismatches such that smaller devices can be used to achieve better performance.

2. List of Related Art

The following is a listed of related art that is referred to in and/or forms some of the basis of other sections of this specification. All of these listed references are therefore incorporated by reference in their entirety for all purposes.

[1] S. Nassif, "Modeling and analysis of manufacturing variations," *IEEE CICC*, pp. 223-228, 2001.

[2] Semiconductor Industry Associate, *International Technology Roadmap for Semiconductors*, 2005.

[3] G. Gielen and R. Rutenbar, "Computer-aided design of analog and mixedsignal integrated circuits," *Proceedings of the IEEE*, vol. 88, no. 12, pp. 1825-1852, December 2000.

[4] G. Debyser and G. Gielen, "Efficient analog circuit synthesis with simultaneous yield and robustness optimization," *IEEE ICCAD*, pp. 308-311, 1998.

[5] A. Seifi, K. Ponnambalam and J. Vlach, "A unified approach to statistical design centering of integrated circuits with correlated parameters," *IEEE Trans. CAS-I*, vol. 46, no. 1, pp. 190-196, January 1999.

[6] F. Schenkel, M. Pronath, S. Zizala, R. Schwencker, H. Graeb and K. Antreich, "Mismatch analysis and direct

[7] X. Li, P. Gopalakrishnan, Y. Xu and L. Pileggi, "Robust analog/RF circuit design with projection-based performance modeling," *IEEE Trans. CAD*, vol. 26, no. 1, pp. 2-15, January 2007.

[8] J. Tschanz, J. Kao, S. Narendra, R. Nair, D. Antoniadis, A. Chandrakasan and V. De, "Adaptive body bias for reducing impacts of die-to-die and within-die parameter variations on microprocessor frequency and leakage," *IEEE JSSC*, vol. 27, no. 11, pp. 1396-1402, November 2002.

[9] T. Chen and S. Naffziger, "Comparison of adaptive body bias (ABB) and adaptive supply voltage (ASV) for improving delay and leakage under the presence of process variation," *IEEE Trans. VLSI*, vol. 11, no. 5, pp. 888-899, 2003.

[10] M. Mani, A. Singh and M. Orshansky, "Joint design-time and post-silicon minimization of parametric yield loss using adjustable robust optimization," *IEEE ICCAD*, pp. 19-26, 2006.

[11] P. Kinget, "Device mismatch and tradeoffs in the design of analog circuits," *IEEE JSSC*, vol. 40, no. 6, pp. 1212-1224, June 2005.

[12] M. Pelgrom, A. Duinmaijer and A. Welbers, "Matching properties of MOS transistors," *IEEE JSSC*, vol. 24, no. 5, pp. 1433-1440, October 1989.

[13] P. Drennan and C. McAndrew, "Understanding MOSFET mismatch for analog design," *IEEE JSSC*, vol. 38, no. 3, pp. 450-456, March 2003.

[14] S. Ray and B. Song, "A 13b linear 40 MS/s pipelined ADC with self-configured capacitor matching," *IEEE ISSCC*, pp. 852-861, 2006.

[15] K. Chan and I. Galton, "A 14b 100 MS/s DAC with fully segmented dynamic element matching," *IEEE ISSCC*, pp. 2390-2399, 2006.

[16] A. Dharchoudhury and S. Kang, "Worse-case analysis and optimization of VLSI circuit performance," *IEEE Trans. CAD*, vol. 14, no. 4, pp. 481-492, April 1995.

[17] E. Felt, S. Zanella, C. Guardiani and A. Sangiovanni-Vincentelli, "Hierarchical statistical characterization of mixed-signal circuits using behavioral modeling," *IEEE ICCAD*, pp. 374-380, 1996.

[18] M. Sengupta, S. Saxena, L. Daldoss, G. Kramer, S. Minehane and J. Chen, "Application-specific worst case corners using response surfaces and statistical models," *IEEE Trans. CAD*, vol. 24, no. 9, pp. 1372-1380, September 2005.

[19] X. Li, J. Le, P. Gopalakrishnan and L. Pileggi, "Asymptotic probability extraction for nonnormal performance distributions," *IEEE Trans. CAD*, vol. 26, no. 1, pp. 16-37, January 2007.

[20] M. Mckay, R. Beckman and W. Conover, "A comparison of three methods for selecting values of input variables in the analysis of output from a computer code," *Technometrics*, vol. 21, no. 2, pp. 239-245, May 1979.

[21] E. Pebesma and G. Heuvelink, "Latin hypercube sampling of Gaussian random fields," *Technometrics*, vol. 41, no. 4, pp. 303-312, November 1999.

[22] A. Papoulis and S. Pillai, *Probability, Random Variables and Stochastic Processes*, McGraw-Hill, 2001.

[23] B. Razavi, *Design of Analog CMOS Integrated Circuits*, McGraw, 2001.

[24] D. Bertsekas, *Dynamic Programming and Optimal Control*, Athena Scientific, 2005.

BRIEF SUMMARY OF THE INVENTION

The present invention is a post-silicon tuning methodology to reduce random mismatches for analog circuits, which targets the creation of a new tunable integrated circuit (IC) design methodology to accommodate large-scale process variations in nano-scale technologies (e.g., sub-90 nm CMOS). The present invention proposes a new tunable methodology that facilitates robust integrated circuit design in nano-scale technologies based on stochastic technique to address such nano-scale design challenges. The disclosed robust design framework is able to create high-performance and reliable integrated circuits with consideration of large-scale process variations, which is a necessary condition to enable further technology scaling for 65 nm and below.

The present invention is an adaptive post-silicon tuning approach to reduce random device mismatches. Instead of over-sizing analog devices, a methodology is proposed that would decompose each device into N fingers and adaptively select the best-matched M ($M \leq N$) fingers based on the post-silicon measurement. Such post-silicon tuning was previously applied to several analog design examples (see Background references [14]-[15]). The objective of this invention is to develop a generalized methodology for post-silicon tuning that can be applied to a broad range of application domains. To do so, tunable analog designs are systematically analyzed and optimized, and these designs demonstrate the substantial benefit offered by post-silicon tuning as compared to simple sizing following the Pelgrom model.

An important contribution of the present invention is to propose a dynamic-programming (DP) algorithm to select the best-matched fingers based on the post-silicon measurement. The proposed DP algorithm is incorporated into a fast Monte Carlo simulation flow for statistical analysis and optimization of the proposed tunable analog circuits. The proposed post-silicon tuning methodology is applied to several commonly-used analog circuit blocks.

To optimally select M fingers out of N ($M \leq N$) candidates, the number of possible combinations increases exponentially with N, thereby making such a discrete selection problem non-trivial to solve. The proposed DP algorithm partitions the complicated optimization problem into multiple, interacted sub-problems. Instead of directly searching all N fingers, the sub-problem is defined to optimally select j fingers out of i ($j \leq i$) candidates where i is initially set to 1 and it is iteratively increased to N. The sub-problem is solved once and its answer is saved, thereby avoiding the work of re-computing the answer every time when the sub-problem is encountered.

In addition, the present invention proposes to utilize quantization to efficiently lump many similar selection options together as a single DP state, thereby further reducing the computational complexity. As will be demonstrated by the numerical examples below, even for small-size problems (N=10~14), the proposed DP algorithm achieves 10~20× speed-up compared with a brute-force search.

Furthermore, the proposed DP algorithm is incorporated into a fast Monte Carlo analysis flow to efficiently predict the performance variations of tunable analog circuits. Note that such a statistical analysis problem cannot be easily solved using most existing techniques (see Background references [16]-[19]). These existing methods assume continuous variations of uncertain parameters, while the proposed adaptive post-silicon tuning is discrete in nature.

The statistical analysis performed during the development of the present invention demonstrates that if the adaptive post-silicon tuning is applied, device mismatch exponentially decreases as area increases: $\sigma_{MISMATCH} \sim \exp(-\alpha \cdot \text{Area})$. For example, a 1.4 μm (width)×50 nm (length) NFET with post-silicon tuning shows the same mismatch variation as a 4×105 μm (width)×50 nm (length) NFET without post-silicon tuning in a commercial 65 nm CMOS process.

The proposed tunable-design methodology of the present invention breaks down into four key concepts:

Digitally configuring fingers of large transistors, or individual transistors that are connected in parallel to form larger transistors, to select a "subset" of the fingers or individual transistors to match a similar transistor or set of transistors, or to derive a parameter value that is as close as possible to a target value. The configuration can be achieved in various ways; e.g., by applying digital controlling signal to (1) the gate and/or bulk of the traditional MOSFET, or (2) one of the two gates of the dual-gate device.

Two proposed tunable circuit topologies for a memory-sense amplifier application (FIG. 15) and an open-loop amplifier of pipelined analog-to-digital converter (ADC) application (FIG. 16), respectively. It has been demonstrated that the standard deviation of the performance variation (i.e., input offset) exponentially decreases with the number of tunable stages when applying post-manufacturing configuration.

An efficient statistical analysis technique based on dynamic programming has been proposed to predict the performance distribution of tunable circuits. A speed-up of 9× has been demonstrated for a small-size problem, and a more significant speed-up would be expected for larger problem sizes.

A novel multi-stage stochastic optimization formulation has been proposed to optimize tunable circuits. The proposed approach incorporates a special routine to handle manufacturing uncertainties in the early design stage.

The proposed techniques of the present invention can be applied to many analog/RF and mixed-signal design problems; e.g., memory design, ADC design, RF transceiver design, etc. Additionally, the proposed techniques can also be applied to the customer-design problems of high-performance digital circuits.

BRIEF DESCRIPTION OF THE DRAWINGS

FIG. 17(c) shows a transistor made up of N fingers.

DETAILED DESCRIPTION

NOTE: Some of the references listed in the Background section are referred to in this description using the reference number.

First Embodiment

Tunable Integrated Circuit Design Containing Analog Devices

Two analog design examples (i.e., a differential transistor pair and a switched-capacitor amplifier) are used in this embodiment to illustrate the basic concept of the proposed adaptive post-silicon tuning. The following two circuit examples rely on transistor matching and capacitor matching, respectively. It should be noted, however, that the proposed post-silicon tuning methodology can be applied to many other analog applications where device matching is critical.

Figure 1:
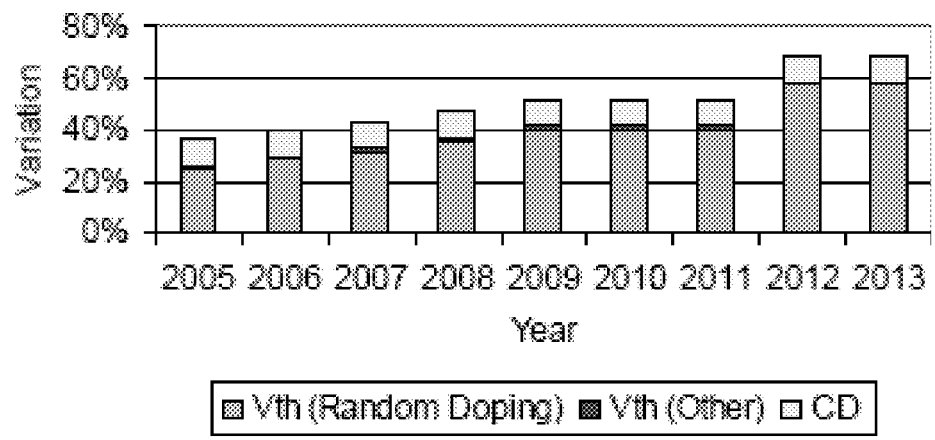
FIG. 1 shows process variations in future IC technologies as discussed in Background Reference [2].
Figure 2:
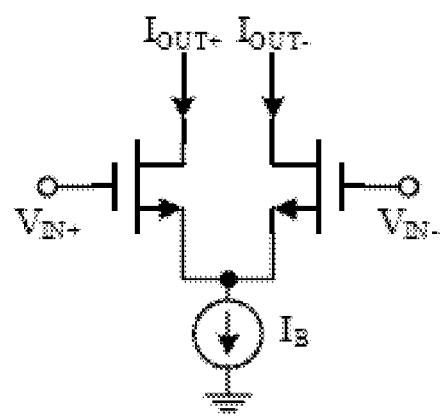
FIG. 2 depicts a simplified schematic of a traditional differential pair of transistors.

Shown in FIG. 2 is the simplified circuit schematic of a traditional differential transistor pair (see Background reference [23]). It utilizes the symmetric topology to make the performance insensitive to inter-die variations. However, random device mismatches make the circuit symmetric and, hence, introduce offset voltage. In general, the transistors of a differential pair must be sufficiently large so that the offset voltage can be minimized.

Figure 3:
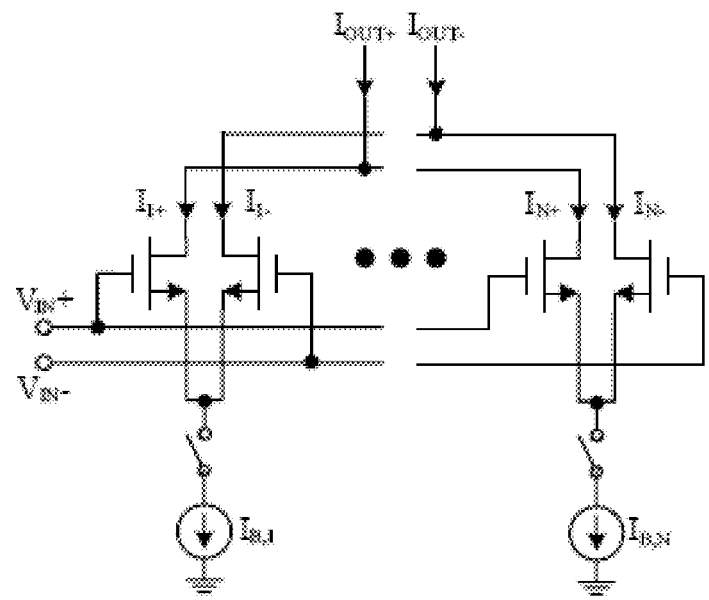
FIG. 3 depicts a simplified schematic of a tunable differential pair of transistors.

An example of tunable differential pair is shown in FIG. 3. The entire differential pair is decomposed into N branches, where each branch can be independently turned on/off by applying the proper digital controlling signal to switch the tail current. Based on the post-silicon measurement, M (M≦N) branches will be adaptively selected to minimize the random mismatch. If M branches $\{S_1, S_2, \ldots, S_M\}$ are selected where $S_i$ is the index of the i-th selected branch, the input-referred offset voltage can be represented as (see Background reference [23]):

$$V_{OS} = \frac{1}{M} \cdot \sum_{i=1}^{M} V_{OS,Si} \qquad \text{(Equation 1)}$$

where $V_{OS,Si}$ denotes the input-referred offset voltage of the $S_i$-th branch.

Since $\{V_{OS,i}; i=1, 2, \ldots, N\}$ are caused by random mismatches, such voltage offsets are typically modeled as independent, zero-mean random variables (see Background references [12]-[13]). In this case, if all branches are selected without post-silicon tuning (i.e., M=N), it is easy to verify that the standard deviation of the offset voltage is inversely proportional to the square root of N: $\sigma_{OS} \sim 1/\mathrm{sqrt}(N)$ (see Background reference [22]), which is consistent with the well-known Pelgrom model (see Background references [12]-[13]). Next, a much smaller offset voltage can be achieved by adaptively selecting M (M≦N) branches via post-silicon tuning, as is discussed in detail infra.

Figure 4:
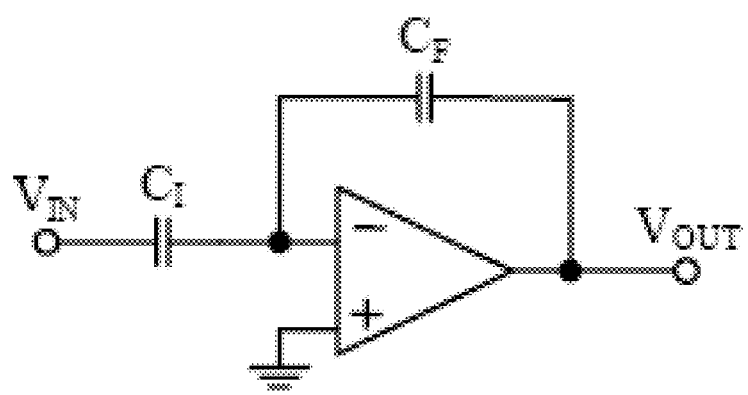
FIG. 4 depicts a simplified schematic of a traditional SC amplifier.

FIG. 4 shows the simplified circuit schematic of a traditional switched-capacitor (SC) amplifier. For simplicity, it is assumed that the operational amplifier in FIG. 4 is ideal. The gain of the SC amplifier is determined by the ratio between the two capacitors: $C_I$ and $C_F$. It is further assumed that $C_I$ equals $C_F$ and that the SC amplifier has a unit gain. The random mismatch between these two capacitors is one of the major sources of gain error.

Figure 5:
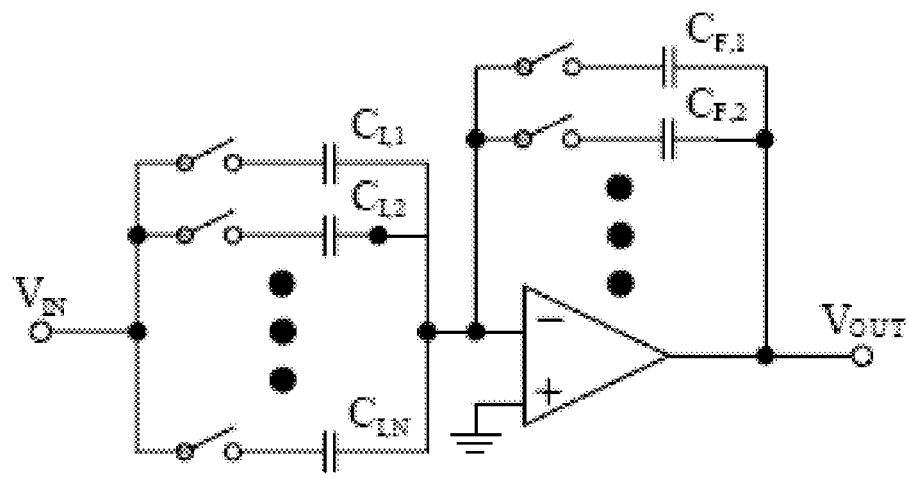
FIG. 5 depicts a simplified schematic of a tunable SC amplifier as an example capacitor-matching problem, where switches are used for digital configuration of M fingers from capacitors I and F, respectively, to reduce mismatch.

The proposed tunable SC amplifier is shown in FIG. 5. Both $C_I$ and $C_F$ are decomposed into N fingers. Based on the post-silicon measurement, M (M≦N) fingers will be adaptively selected to minimize the random mismatch. If M fingers $\{S_{I,1}, S_{I,2}, \ldots, S_{I,M}\}$ and $\{S_{F,1}, S_{F,2}, \ldots, S_{F,M}\}$ are selected for $C_I$ and $C_F$ respectively, then the variations (i.e., the deviation from the mean value) of $C_I$ and $C_F$ can be expressed as:

$$\Delta C_I = \sum_{i=1}^{M} \Delta C_{I,Si} \qquad \text{(Equation 2)}$$

$$\Delta C_F = \sum_{i=1}^{M} \Delta C_{F,Si} \qquad \text{(Equation 3)}$$

where $\Delta C_{I,Si}$ and $\Delta C_{F,Si}$ denote the capacitance variations of the $S_i$-th selected fingers for $C_I$ and $C_F$ respectively. The average capacitor mismatch is defined as:

$$\Delta C_{MIS} = \frac{1}{M} \cdot \sum_{i=1}^{M} \Delta C_{I,Si} - \sum_{i=1}^{M} \Delta C_{F,Si} \qquad \text{(Equation 4)}$$

Note that Equation 4 has a slightly different form than that in Equation 1. What remains is the modeling and optimization method that can be used to minimize the mismatch as expressed in Equation 4.

The key problem posed by the proposed post-silicon tuning methodology is how to optimally select the best configuration to minimize the matching error. Such an optimization problem can be stated as follows: Given $\{V_{OS,i}; i=1, 2, \ldots, N\}$ for the tunable differential pair or $\{\Delta C_{I,i}, \Delta C_{F,i}; i=1, 2, \ldots, N\}$ for the tunable SC amplifier, select M branches/fingers out of N (M≦N) candidates such that the absolute value of the mismatch defined in Equation 1 or Equation 4 is minimized. For this optimization problem, M can be either pre-determined or variable. If M is a variable, then the optimal M value should be selected to achieve the minimal mismatch. This requires exploration of all possible values for M to select the optimal scenario. Therefore, in what follows, the focus is on the situation where M is variable, since any other optimization with a pre-determined M is a sub-problem of this general case.

The aforementioned optimization problem is discrete in nature. To solve it, one straightforward approach is to enumerate all possible combinations (referred to as "brute-force search" herein). However, the total number of all possible configurations exponentially increases with N, thereby quickly making the computation infeasible. Theoretically, it can be proven that this discrete optimization problem for mismatch minimization is NP-hard. Namely, any algorithm that exactly solves the problem must require exponential runtime in the worst case.

Motivated by this observation, we propose a dynamic-programming (DP) approach to search for the optimal configuration that yields the minimal matching error (see Background reference [24]). The essence of the proposed dynamic programming is to partition the complicated discrete optimization problem into multiple, interacted sub-problems. Instead of directly searching all N branches/fingers, our sub-problem is defined to optimally select j branches/fingers out of i (j≦i) candidates where i is initially set to 1 and it is iteratively increased to N. The sub-problem is solved once and its answer is saved, thereby avoiding the work of re-computing the answer every time when the sub-problem is encountered. In addition, this embodiment proposes to utilize quantization to lump many similar configurations together as a single DP state, thereby further reducing the computational complexity. In what follows, the DP algorithm is first developed for the tunable differential pair in FIG. 3, and then extends it to optimize the tunable SC amplifier in FIG. 5.

The proposed dynamic programming follows the standard formulation described in Background reference [24]. It consists of two major components: (1) a finite set $\Omega$ that contains a number of quantized matching error values, and (2) a three-dimensional table T(i, j, k) that saves all possible matching errors.

The finite set $\Omega$ is used to quantize matching errors such that similar error values are approximated as a single numerical number. It, in turn, allows the lumping of many configurations with similar matching errors as a single DP state.

Given the offset voltage for each branch $\{V_{OS,i}; i=1, 2, \ldots, N\}$ and M selected branches $\{S_1, S_2, \ldots, S_M\}$, the matching error is defined as:

$$Err_{OS} = \sum_{i=1}^{M} V_{OS,Si} \qquad \text{(Equation 5)}$$

Equation 5 is identical to Equation 1 except for a scaling factor M. It is easy to verify that for any $M \in \{1, 2, \ldots, N\}$, the matching error in Equation 5 is bounded by:

$$B_L = \sum_{V_{OS,Si}<0} V_{OS,Si} \qquad \text{(Equation 6)}$$

$$B_U = \sum_{V_{OS,Si}<0} V_{OS,Si} \qquad \text{(Equation 7)}$$

where $B_L$ and $B_U$ represent the lower bound and the upper bound, respectively.

Discretizing the interval $[B_L, B_U]$ yields the following finite set:

$$\Omega = \{B_L, B_L+h, \ldots, B_U-h, B_U\} \quad \text{(Equation 8)}$$

where h is the step size. For example, if $B_L=-1$, $B_U=1$ and h=0.5, then $\Omega=\{-1, -0.5, 0, 0.5, 1\}$.

Given the set $\Omega$ in Equation 8, $\{V_{OS,i}; i=1, 2, \ldots, N\}$ is quantized by mapping each $V_{OS,i}$ to the nearest element in $\Omega$. It, in turn, yields:

$$\{V_{OS,i}^\Omega; i=1,2,\ldots,N\} \quad \text{(Equation 9)}$$

For example, if $\{V_{OS,1}=-0.3, V_{OS,2}=0.9\}$ and $\Omega=\{-1, -0.5, 0, 0.5, 1\}$, then $\{V_{OS,1}^\Omega=-0.5, V_{OS,2}^\Omega=1\}$.

The second key component of the proposed dynamic programming is a three-dimensional table $T(i,j,k)$, where $i,j \in \{1, 2, \ldots, N\}$ and $k \in \Omega$. Note that the index k can be a rational or real (not integer) number, depending on the discretization in Equation 8:

$T(i, j, k)=1$ (true) if and only if $\exists A \in 2^{\{1, 2, \ldots, i\}}$ such that:

$$|A| = j \quad \text{(Equation 10)}$$

$$\sum_{i \in A} V_{OS,i}^\Omega = k \quad \text{(Equation 11)}$$

where $|A|$ stands for the size of the set A and $2^{\{1, 2, \ldots, i\}}$ denotes the power set of $\{1, 2, \ldots, i\}$ (i.e., the collection of all subsets of $\{1, 2, \ldots, i\}$). For instance, $2^{\{1, 2\}}=\{\{\}, \{1\}, \{2\}, \{1,2\}\}$.

$T(i, j, k)=0$ (false) otherwise.

The three-dimensional table $T(i, j, k)$ contains all possible matching errors when selecting j branches from $\{1, 2, \ldots, i\}$. Starting from i=1, the best-matched j branches out of i ($i \leq i$) candidates are recursively found, the answer is saved in $T(i, j, k)$, and then i is increased until i=N. As i eventually reaches N, $T(N, j, k)$ provides all possible matching errors when selecting j branches out of N candidates. Similar tables have been widely used in many other dynamic-programming problems (see Background reference [24]). Next, this embodiment demonstrates how to efficiently fill the table $T(i, j, k)$ for our proposed post-silicon tuning problem.

Creating $T(i, j, k)$ involves two major steps: (1) initialization, and (2) recursive iteration. The first initialization step is to fill in all table entries for j=1. This step is trivial, since we only consider the cases where a single branch is selected.

$$T(i, j, k) = \begin{pmatrix} i = 1, 2, \ldots, N \\ k = V_{OS,1}^\Omega, k = V_{OS,2}^\Omega, \ldots, k = V_{OS,j}^\Omega \end{pmatrix} \quad \text{(Equation 12)}$$

Next, during the second step, a recurrence relation must be created that allows the iterative filling-in of all other entries of the table $T(i, j, k)$. Note that $T(i, j, k)=1$ if and only if any of the following two conditions is satisfied:

$T(i-1, j, k)=1$, i.e., selecting j branches from $\{1, 2, \ldots, i-1\}$ yields the error value k and the i-th element $V_{OS,i}^\Omega$ will not be selected for $T(i, j, k)$ to be true.

$T(i-1, j-1, k-V_{OS,i}^\Omega)=1$; i.e., selecting j-1 branches from $\{1, 2, \ldots, i-1\}$ yields the error value $k-V_{OS,i}^\Omega$ and the i-th element $V_{OS,i}^\Omega$ will be selected for $T(i, j, k)$ to be true.

Based on this observation, the following recurrence relation can be concluded:

$$T(i,j,k) = T(i-1,j,k) \vee T(i-1,j-1,k-V_{OS,i}^\Omega) \quad \text{(Equation 13)}$$

where $\vee$ stands for the logic operator OR.

Given Equation 12 and Equation 13, one can iteratively fill in the three-dimensional table $T(i, j, k)$, thereby yielding the matching error values for all possible configurations. During this process, a list of index values $\{S_1, S_2, \ldots, S_j\}$ can be saved for each table entry that is 1 (true), if one wants to know which branches are selected for $T(i, j, k)$ to be true.

After the table $T(i, j, k)$ is available, the final step is to search for all entries that are 1 (true) and scale the matching error in Equation 5 back to the offset voltage in Equation 1. For example, if $T(N, j, k)=1$, meaning that selecting j branches out of N candidates results in the matching error k, the corresponding offset voltage is k/j. Algorithm 1 summaries the proposed DP algorithm for the tunable differential pair.

Algorithm 1, Dynamic Programming for a Differential Pair
1. Start from a given set of $\{V_{OS,i}; i=1, 2, \ldots, N\}$ and a given step size h.
2. Calculate the lower bound and upper bound using Equations 6 and 7.
3. Create the finite set $\Omega$ in Equation 8.
4. Map $\{V_{OS,i}; i=1, 2, \ldots, N\}$ to $\{V_{OS,i}^\Omega; i=1, 2, \ldots, N\}$ in Equation 9.
5. Initialize the table $T(i, j, k)$ based on Equation 12.
6. Iteratively fill in all other entries of the table $T(i, j, k)$ using the recurrence relation in Equation 13.
7. For any $j \in \{1, 2, \ldots, N\}$ and $k \in \Omega$, if $T(N, j, k)=1$, calculate the corresponding offset voltage $V_{OS}=k/j$ based on the definition in Equation 1.
8. Select the best configuration that yields the minimal offset voltage.

Algorithm 2, Adaptive Control for the Quantization Step Size h
1. Start from a given step size h.
2. Set r=1.
3. Apply Algorithm 1 to estimate the minimal offset voltage $V_{OS}^r$, where the superscript r stands for the estimation result from the r-th iteration.
4. If the estimated offset voltage value is unchanged between two successive iterations; i.e., $$\frac{|V_{OS}^r - V_{OS}^{r-1}|}{V_{OS}^r} \leq \varepsilon \quad \text{(Equation 14)}$$

where $\varepsilon$ is a pre-defined error tolerance, then stop. Otherwise, r=r+1, h=h/2, and return Step 3.

Algorithm 1 is based on a given step size h. In practice, the value of h can be adaptively controlled for a given accuracy requirement. Starting from a large step size h, h should be iteratively reduced (e.g., divided by 2) if the error is not sufficiently small. Algorithm 2 outlines a simplified algorithm for adaptive step control.

In summary, this embodiment proposes a DP algorithm to optimally select M branches out of N candidates such that the random mismatch is minimized for the tunable differential pair in FIG. 3. The proposed dynamic programming applies quantization to approximate the solution of the original discrete optimization problem that is NP-hard. In what follows, the computational complexity of the proposed algorithm is theoretically analyzed and its greater efficiency is demonstrated as compared to a simple brute-force search.

The computational complexity of the proposed dynamic programming is mainly determined by the size of the table T(i, j, k), where $$|T(i,j,k)| = N^2 \cdot (B_U - B_L)/h \quad \text{(Equation 15)}$$

denotes the size of the table T(i, j, k). To determine the relation between |T(i, j, k)| and N, it is necessary to further know how $B_U$, $B_L$ and h depend on the value N. Studying Equation 6, one can easily notice that the lower bound $B_L$ is bounded by:

$$B_L \geq -\sum_{i=1}^{N} |V_{OS,i}| \quad \text{(Equation 16)}$$

Since the offset voltages $\{V_{OS,i}; i=1, 2, \ldots, N\}$ are typically modeled as independent random variables (see Background references [12]-[13]), the standard deviation of the random variable |VOS,1|+|VOS,2|+| ... +|VOS,N| is proportional to the square root of N [22], yielding:

$$B_L \sim -\sqrt{N} \quad \text{(Equation 17)}$$

The relation between $B_U$ and N can be similarly derived as:

$$B_U \sim \sqrt{N} \quad \text{(Equation 18)}$$

On the other hand, for a given accuracy requirement, the step size h depends on the final matching error $\text{Err}_{OS}$ defined in Equation 5. For example, if $\text{Err}_{OS}$ is small, a small h should be automatically selected by Algorithm 2 to keep the relative error smaller than C in Equation 14. As will be demonstrated by the numerical examples below, for the tunable differential pair in FIG. 3, the matching error exponentially decreases as N increases. Therefore, given a fixed error tolerance C in Equation 14, the step size h is an exponential function of N:

$$h \sim e^{-\alpha \cdot N} \quad \text{(Equation 19)}$$

where a is α positive real number.

Substituting Equations 17-19 into Equation 15 gives the final computational complexity of the proposed dynamic programming:

$$O(N^2 \cdot \sqrt{N} \cdot e^{\alpha \cdot N}) \quad \text{(Equation 20)}$$

than the complexity of the brute-force search, which is close to $2^{2N}$ in this particular application. The proposed DP algorithm achieves 20× speed-up, even if N is as small as 10.

Algorithm 3, Dynamic Programming for SC Amplifier
1. Start from a given set of $\{\Delta C_{I,i}, \Delta C_{F,i}; i=1, 2, \ldots, N\}$ and a given step size h.
2. Apply the dynamic programming described in Algorithm 1 to build the three-dimensional tables $T_I(i, j, k_I)$ and $T_F(i, j, k_F)$ for $\Delta C_I$ in Equation 2 and $\Delta C_F$ in Equation 3, respectively.
3. For any possible values of j, $k_I$ and $k_F$, if $T_I(N, j, k_I)=1$ and $T_F(N, j, k_F)=1$, calculate the corresponding capacitor mismatch $C_{MIS}=(k_I-k_F)/j$ based on the definition in Equation 4.
4. Select the best configuration that yields the minimal capacitor mismatch.

Algorithm 1 can be extended to solve the capacitor matching problem in Equation 4. The basic idea is to first apply the same dynamic programming to calculate the capacitance variations for $\Delta C_I$ in Equation 2 and $\Delta C_F$ in Equation 3, respectively. Next, all possible combinations of $\Delta C_I$ and $\Delta C_F$ are checked and the optimal configuration with the smallest mismatch $C_{MIS}$ (defined in Equation 4) is selected. Algorithm 3 summarizes the major steps for the dynamic programming of the SC amplifier. Although Algorithm 3 assumes a given step size h, the value of h can be iteratively determined by an adaptive control scheme similar to Algorithm 2.

The computational cost of Algorithm 3 is dominated by three major tasks: (1) creating the table $T_I(i, j, k_I)$, (2) creating the table $T_F(i, j, k_F)$, and (3) checking all combinations between $T_I(N, j, k_I)$ and $T_F(N, j, k_F)$ to calculate all possible values of the capacitor mismatch. As discussed above, the computational complexities of the first two tasks are respectively determined by:

$$|T_I(i,j,k_I)| \sim N^2 \cdot \sqrt{N}/h \quad \text{(Equation 21)}$$

$$|T_F(i,j,k_F)| \sim N^2 \cdot \sqrt{N}/h \quad \text{(Equation 22)}$$

where $|T_I(i, j, k_I)|$ and $|T_F(i, j, k_F)|$ denote the size of the tables $T_I(i, j, k_I)$ and $T_F(i, j, k_F)$, respectively.

The computational complexity of the third task is determined by:

$$|T_I(i,j,k_I)| \cdot |T_F(i,j,k_F)| \sim (N \cdot \sqrt{N}/h)^2 = N^3/h^2 \quad \text{(Equation 23)}$$

where $|T_I(i, j, k_I)|$ and $|T_F(i, j, k_F)|$ are both two-dimensional tables, since their first-dimension index is fixed to N.

On the other hand, given a fixed error tolerance c in Equation 14, the step size h exponentially decreases as N increases, similar to the case discussed above. If h is expressed as the exponential function in Equation 19, the overall computational complexity of Algorithm 3 is dominated by Equation 23:

$$O(N^3 \cdot e^{2\alpha \cdot N}) \quad \text{(Equation 24)}$$

As will be demonstrated by the numerical examples below, the computational complexity of Algorithm 3 is much lower than the complexity of the brute-force search which is close to $2^{2N}$ in this particular application. The proposed DP algorithm achieves 20× speed-up, even if N is as small as 10.

To quantitatively demonstrate the substantial benefit offered by the proposed post-silicon tuning, the statistical performance distribution with post-silicon tuning must be estimated and compared with the well-known Pelgrom model when no post-silicon tuning is applied. For this purpose, a fast statistical analysis flow is proposed for tunable analog circuits in this section. The proposed statistical analysis flow is facilitated by a combination of controlled random sampling and dynamic programming.

Note that our statistical analysis problem cannot be easily solved using most existing techniques (see Background references [16]-[19]). These existing methods assume continuous variations of uncertain parameters, while the proposed adaptive post-silicon tuning is discrete in nature.

The proposed fast Monte Carlo analysis flow is shown in Algorithm 4. Instead of directly drawing random samples from a random number generator, the proposed fast Monte Carlo analysis creates sampling points from a controlled random sequence (i.e., Latin hypercube sampling) such that high estimation accuracy can be achieved by using a small number of sampling points (see Background References [20]-[21]). The key idea of Latin hypercube sampling is to fill the high-dimensional random space based on the given probability density function pdf(•) and make the sampling point distribution close to pdf(•) as much as possible. Next, for each Latin hypercube sampling point, the DP algorithm proposed above is applied to find the minimal mismatch. Finally, the mismatch values calculated from all random samples are utilized to estimate the random probability distribution. The proposed fast Monte Carlo analysis flow is applied to several circuit examples later in the specification.

Algorithm 4, Fast Monte Carlo Analysis for Tunable Circuits
1. Generate L random samples $\{V_{OS,i}^{(l)}; i=1, 2, \ldots, N; l=1, 2, \ldots, L\}$ or $\{\Delta C_{I,i}^{(l)}, \Delta C_{F,i}^{(l)}; i=1, 2, \ldots, N; l=1, 2, \ldots, L\}$ using Latin hypercube sampling (see Background references [20]-[21]), where the subscript i denotes the i-th branch/finger and the superscript l stands for the l-th sampling point.
2. For each random sample $l \in \{1, 2, \ldots, L\}$, apply dynamic programming (Algorithm 1 or Algorithm 3) to estimate the minimal mismatch ($V_{OS}^{(l)}$ or $C_{MIS}^{(l)}$).
3. Given the L samples for the performance of interest (i.e., $V_{OS}^{(l)}$ or $C_{MIS}^{(l)}$), estimate the statistical characteristics (e.g., standard deviation, probability distribution, etc.).

The efficacy of the proposed post-silicon tuning methodology is demonstrated using two circuit examples: a differential pair and a switched-capacitor amplifier. Both circuit examples are implemented with a commercial 65 nm CMOS process. All numerical experiments are run on a Linux 2.6 GHz server. Two major observations will be concluded from our numerical experiments:

When applying the adaptive post-silicon tuning, the standard deviation of random mismatch exponentially decreases as N (the number of total branches/fingers) increases. This result is dramatically better than the well-known Pelgrom model when no post-silicon tuning is applied and the resulting mismatch is inversely proportional to the square root of N.

The proposed dynamic programming significant reduces the computational cost compared with the brute-force search (i.e., simply enumerating all possible configurations). A 10~20× speed-up is demonstrated even if N is as small as 10~14.

Figure 15:
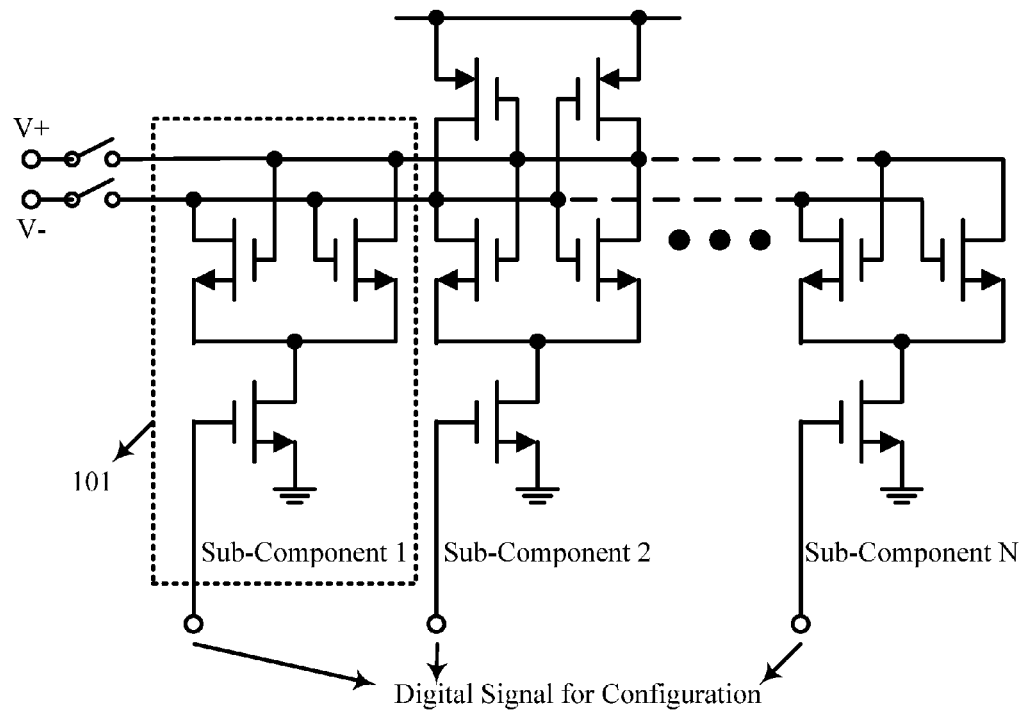
FIG. 15 depicts the schematic of a proposed a tunable memory-sense amplifier that can be configured with digital signals.

The proposed post-silicon tuning methodology is applied to the tunable differential pair in FIG. 3. Note that tunable design methodology requires additional circuitry for post-manufacturing measurement and configuration. Likewise, this methodology can be applied to more-complex systems, including:

A more-complex tunable amplifier that uses digital signals for configuration, such as depicted in FIG. 15, which shows a component with N sub-components (with sub-components 3 through N−1 omitted for clarity). Each sub-component is capable of being rendered operative or inoperative based upon a digital configuration signal as shown. The leftmost of the digital configuration signals, for example, determines whether sub-component 1 (denoted by dashed line 101) is operative or inoperative. The number N might be as few as three or four. The number N might be as large as two dozen, or perhaps larger. The goal, of course, is that by a good selection of sub-components, the component would turn out to be well-balanced as between its two signal inputs.

Figure 16:
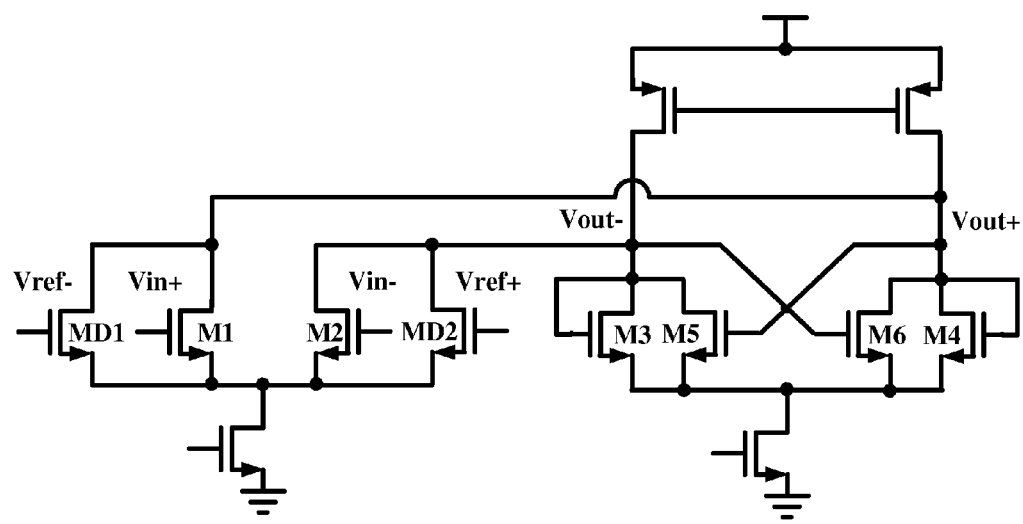
FIG. 16 shows a simplified schematic of an open-loop amplifier.

An open-loop amplifier of pipelined analog-to-digital converter (ADC) application, such as depicted in FIG. 16.

Figure 17:
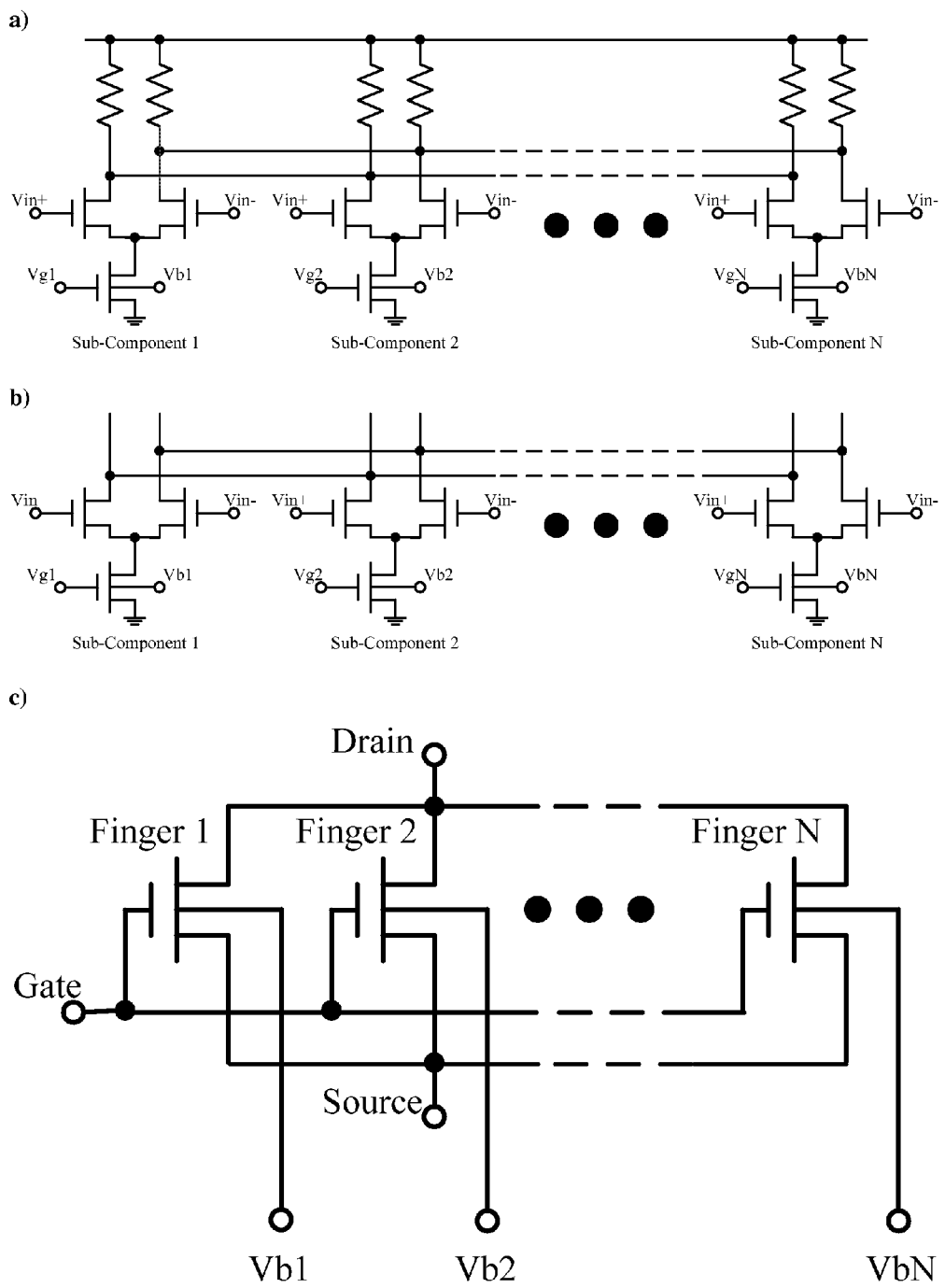
FIG. 17 illustrates variations (schematics (a) and (b)) of a memory-sense-amplifier example, where the input differential pair is digitally configured to minimize random mismatches by adjusting tail transistor gate and/or body bias.

A memory-sense-amplifier, where the input differential pair is digitally configured to minimize random mismatches by adjusting tail transistor gate and/or body bias, such as that depicted in FIG. 17(a).

FIGS. 17(a) and 17(b) show variation of a component with N sub-components (with sub-components 3 through N−1 omitted for clarity). Each sub-component is capable of being rendered operative or inoperative based upon a digital configuration signal Vgi or Vbi (where i is 1, 2, ..., N) as shown.

The left-most of the digital configuration signals, for example, determines whether sub-component 1 is operative or inoperative.

FIG. 17(c) shows a transistor made up of N fingers. Fingers 3 through N−1 are omitted for clarity. Each finger is capable of being rendered operative or inoperative based upon a digital configuration signal Vbi (where i is 1, 2, ..., N) as shown. Digital configuration signal Vb1, for example, determines whether finger 1 is operative or inoperative. The goal is that by a good selection of on/off values for the Vb signals, the overall result will be that the transistor has some desired operational parameter such as the current resulting from a particular control voltage. If an analog circuit were to contain, for example, two transistors of the type shown in FIG. 17(c), then appropriate selection of on/off values for the respective Vb signals may offer the prospect of an extremely good match between the two transistors, as to some operational parameter.

As an example for illustration purposes, all transistor fingers in the differential pair are selected to have the size of 100 nm (width)×50 nm (length), which is the minimal feature size of this technology.

The offset voltage $\{V_{OS,i}; i=1, 2, \ldots, N\}$ of one branch is characterized by transistor-level simulation. The device model provided by the foundry contains statistical information to model both inter-die variations and local device mismatches. The transistor-level simulation result verifies that the offset voltage $V_{OS,i}$ is almost independent of the inter-die variations. For this reason, $\{V_{OS,i}; i=1, 2, \ldots, N\}$ of different branches are modeled as independent random variables.

Figure 6:
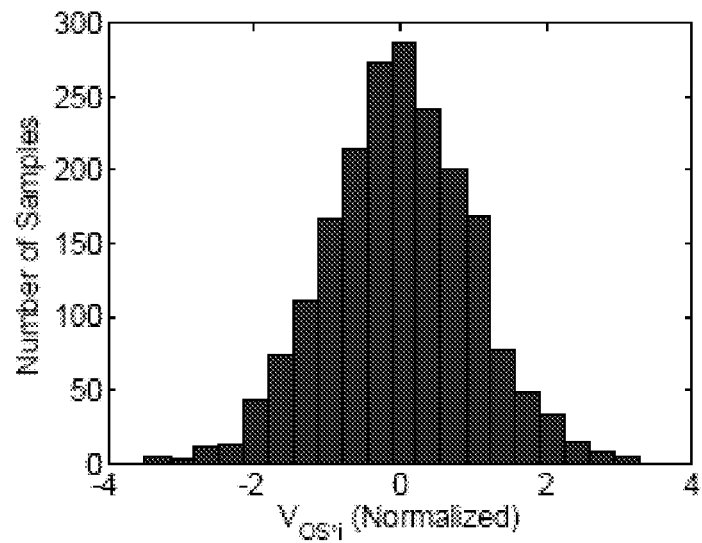
FIG. 6 illustrates the random offset voltage ($V_{OS,i}$) of one branch estimated by 2000 transistor-level Monte Carlo simulation samples.

In addition, the transistor-level Monte Carlo analysis shows that the offset voltage $V_{OS,i}$ can be approximated as a zero-mean Normal distribution, as shown in FIG. 6. Note that $V_{OS,i}$ is normalized in FIG. 6 such that its standard deviation is equal to 1, as required by our non-disclosure agreement with the foundry. $\{V_{OS,i}; i=1, 2, \ldots, N\}$ are modeled as N independent standard Normal distributions (i.e., zero mean and unit variance) in this example.

Figure 7:
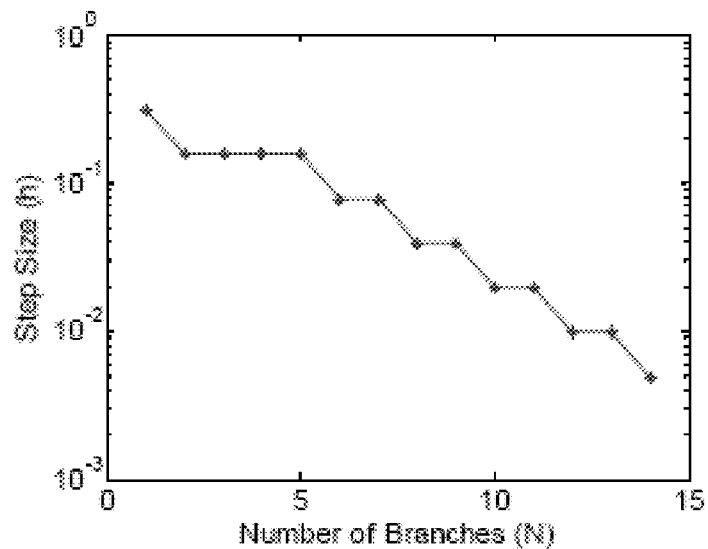
FIG. 7 shows part of the statistical analysis results for the proposed tunable design: The standard deviation of the offset voltage decreases as the total number of branches (N) increases.

Given the normalized offset voltages $\{V_{OS,i}; i=1, 2, \ldots, N\}$, Monte Carlo analysis (Algorithm 4) was run with $10^4$ samples to estimate the standard deviation $\sigma_{OS}$ of the offset voltage $V_{OS}$ defined in Equation 1 after post-silicon tuning is applied. For testing and comparison, both the proposed dynamic programming (DP-MC) and the brute-force search (BS-MC) are utilized within the Monte Carlo flow to search for the optimal configuration that yields the minimal mismatch. The error tolerance $\epsilon=1\%$ in Equation 14 was set to adaptively select the quantization step size h for dynamic programming. FIG. 7 shows the values of the estimated $\sigma_{OS}$ as the total number of branches N varies from 1 to 14.

From the result in FIG. 7, the proposed post-silicon tuning methodology achieves $\sigma_{OS}$~exp(−0.54 N), while the well-known Pelgrom model predicts an improvement of only $\sigma_{OS}$~1/sqrt(N).

To further demonstrate the substantial benefit offered by the proposed post-silicon tuning, Table 1 outlines the required transistor sizes to achieve the same $\sigma_{OS}$ when post-silicon tuning is and is not applied. Note that a 1.4 µm (width)×50 nm (length) transistor with post-silicon tuning offers the same mismatch variation as a $4\times10^5$ µm (width)×50 nm (length) transistor without post-silicon tuning in this differential pair example.

TABLE 1

Required Total Gate Width to Achieve the Given $\sigma_{OS}$
(assuming minimal gate length 50 nm for all cases)

| $\sigma_{OS}$ | /w Tuning | | w/o Tuning |
|---|---|---|---|
| | # of Branches | Width (μm) | Width (μm) |
| $1.00 \times 10^{0}$ | 1 | 0.1 | $1.00 \times 10^{-1}$ |
| $4.63 \times 10^{-1}$ | 2 | 0.2 | $4.67 \times 10^{-1}$ |
| $1.44 \times 10^{-1}$ | 4 | 0.4 | $4.79 \times 10^{0}$ |
| $5.08 \times 10^{-2}$ | 6 | 0.6 | $3.88 \times 10^{1}$ |
| $1.91 \times 10^{-2}$ | 8 | 0.8 | $2.74 \times 10^{2}$ |
| $7.63 \times 10^{-3}$ | 10 | 1.0 | $1.72 \times 10^{3}$ |
| $2.77 \times 10^{-3}$ | 12 | 1.2 | $1.30 \times 10^{4}$ |
| $4.85 \times 10^{-4}$ | 14 | 1.4 | $4.24 \times 10^{5}$ |

It is important to note that the proposed post-silicon tuning methodology requires control and measurement circuitries for adaptive configuration. The area overhead for these additional circuitries is not included in Table 1. However, it is expected that the additional cost for post-silicon configuration is easily warranted based on the significant area reduction shown in Table 1.

Figure 8:
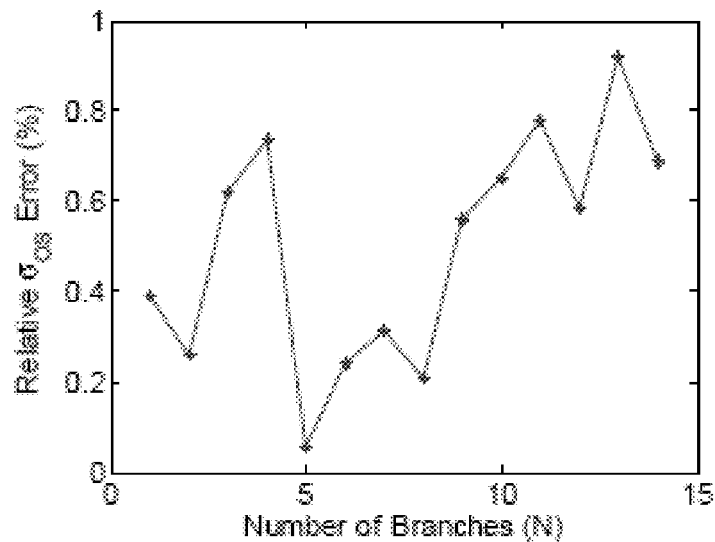
FIG. 8 shows the computational time comparison of dynamic programming (DP-MC) and brute-force search (BS-MC).

As discussed in above, the quantization step size h in Algorithm 1 should be decreased to satisfy the given relative error tolerance, as the total number of branches N increases and the offset variation $\sigma_{OS}$ decreases. Given the error tolerance $\epsilon=1\%$ in Equation 14, Algorithm 2 adaptively determine the step size h for each value of N, as shown in FIG. 8. Note that h exponentially decreases as N increases.

Figure 9:
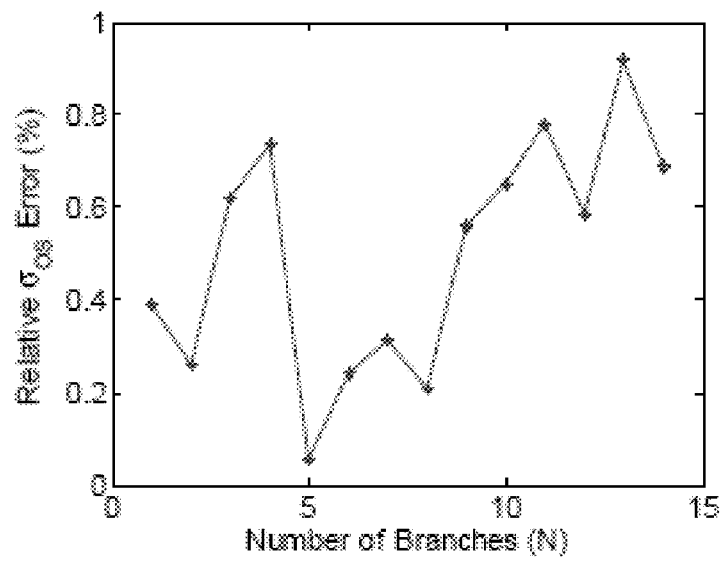
FIG. 9 shows the relative estimation errors of $\sigma_{OS}$ for DP-MC are smaller than 1% for all values of N.

The same set of Monte Carlo samples was used for both the proposed dynamic programming (DP-MC) and the brute-force search (BS-MC). It, in turn, allows us to compare the estimated $\sigma_{OS}$ values from DP-MC and BS-MC, and use their relative difference as a criterion to measure the error incurred by the quantization of the DP-MC flow. In this example, the relative estimation errors of $\sigma_{OS}$ are well-controlled (<1%) for all values of N, as shown in FIG. 9.

Figure 10:
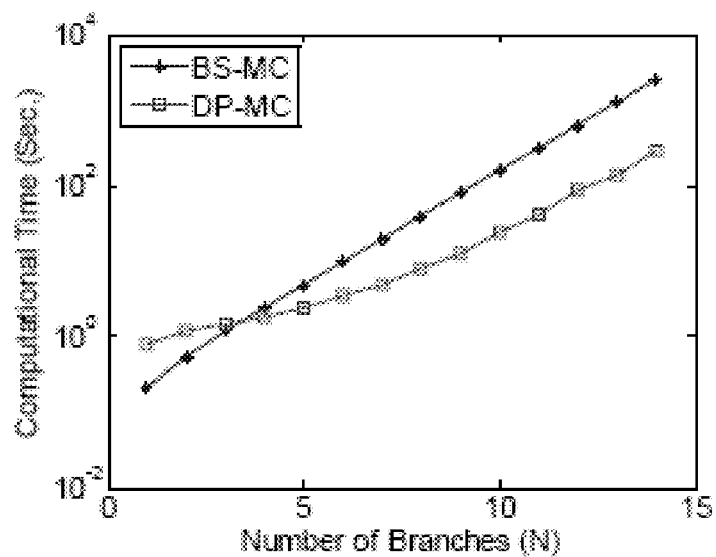
FIG. 10 shows the computational time comparison of dynamic programming (DP-MC) and brute-force search (BS-MC).

FIG. 10 shows the computational time for both the proposed dynamic programming (DP-MC) and the brute-force search (BS-MC). The brute-force search has a complexity of $O(2^N)$, since it enumerates all possible configurations. In this example, even if the value of N is as small as 14, the proposed DP algorithm achieves 10× speed-up compared with the brute-force search. It is expected that the efficiency of the dynamic programming will be more pronounced as N further increases.

The proposed post-silicon tuning methodology was applied to the tunable SC amplifier in FIG. 5. The capacitor mismatch defined in Equation 4 is independent of inter-die process variations; therefore, only local mismatches are considered in this example. The capacitor mismatches $\{\Delta C_{I,i}, \Delta C_{F,i}; i=1, 2, \ldots, N\}$ of all fingers are normalized and modeled as independent standard Normal distributions.

Figure 11:
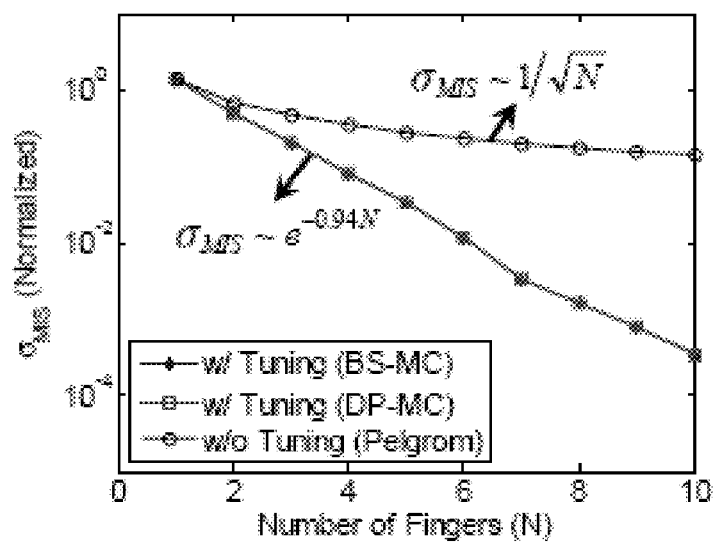
FIG. 11 shows the standard deviation of the capacitor mismatch ($\sigma_{MIS}$) decreases as the total number of fingers (N) increases.

Monte Carlo analysis (Algorithm 4) was run with 104 samples to estimate the standard deviation $\sigma_{MIS}$ of the capacitor mismatch defined in Equation 4 after post-silicon tuning is applied. The error tolerance in Equation 14 is set to $\epsilon=1\%$ for adaptive step size control (also called adaptive configuration). FIG. 11 shows the values of the estimated $\sigma_{MIS}$ where both the proposed dynamic programming (DP-MC) and the brute-force search (BS-MC) are utilized to search for the optimal configuration with the minimal mismatch. Note that, in this example, the proposed post-silicon tuning methodology achieves $\sigma_{MIS} \sim \exp(-0.94 N)$, while the well-known Pelgrom model predicts an improvement of only $\sigma_{MIS} \sim 1/\sqrt{N}$.

Figure 12:
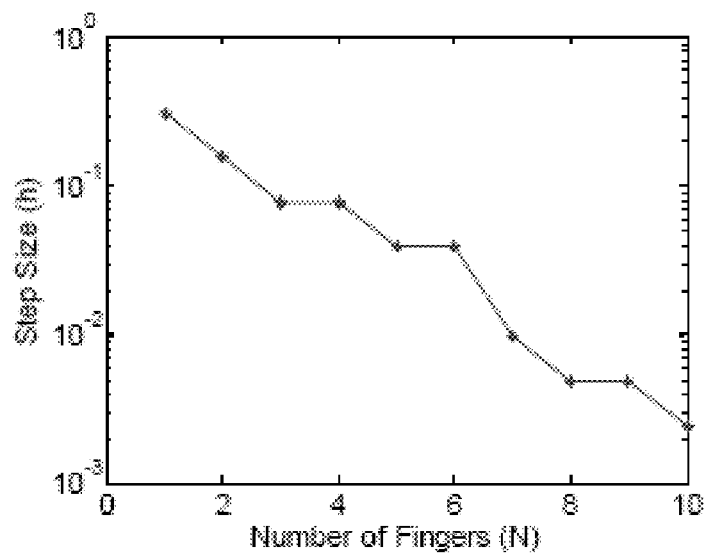
FIG. 12 shows the quantization step size (h) decreases for dynamic programming as the total number of fingers (N) increases.
Figure 13:
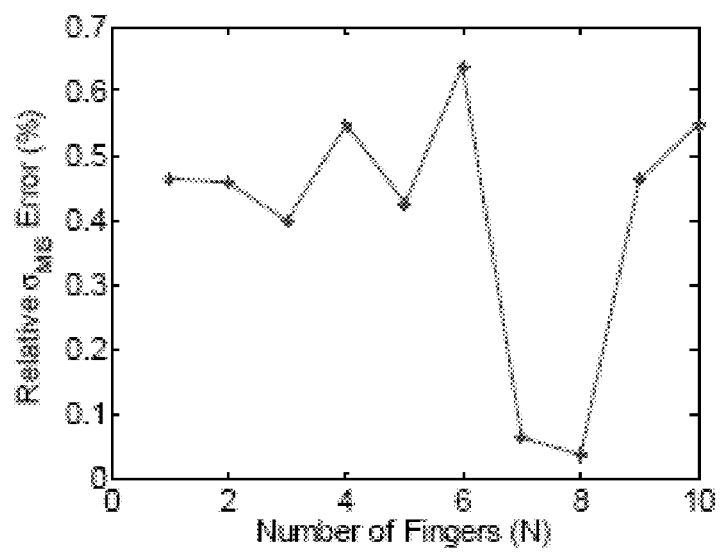
FIG. 13 shows the relative estimation errors of $\sigma_{MIS}$ for DP-MC are smaller than 1% for all values of N.
Figure 14:
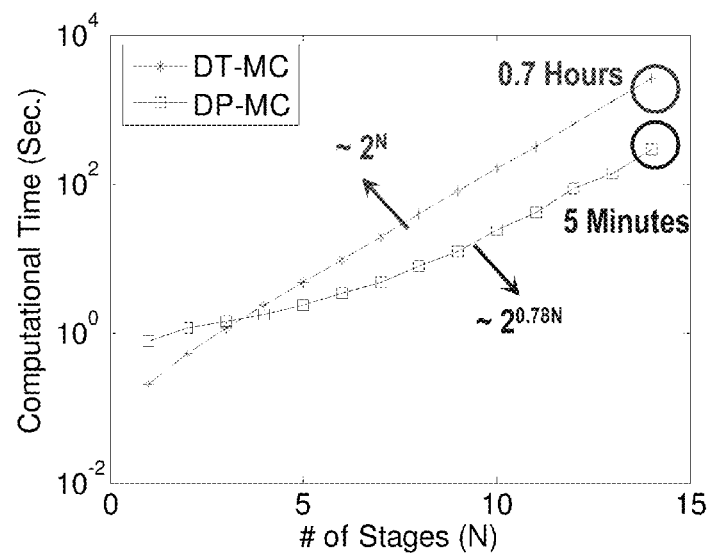
FIG. 14 shows part of the statistical analysis results for the proposed tunable design: The plot of the computational time comparison of Monte-Carlo-based dynamic programming (DP-MC) and Monte Carlo-based brute-force search (BS-MC) indicates that the proposed DP-MC achieves 9× speed-up over the traditional direct Monte Carlo even if the number of stages is as small as 14.
Figure 18:
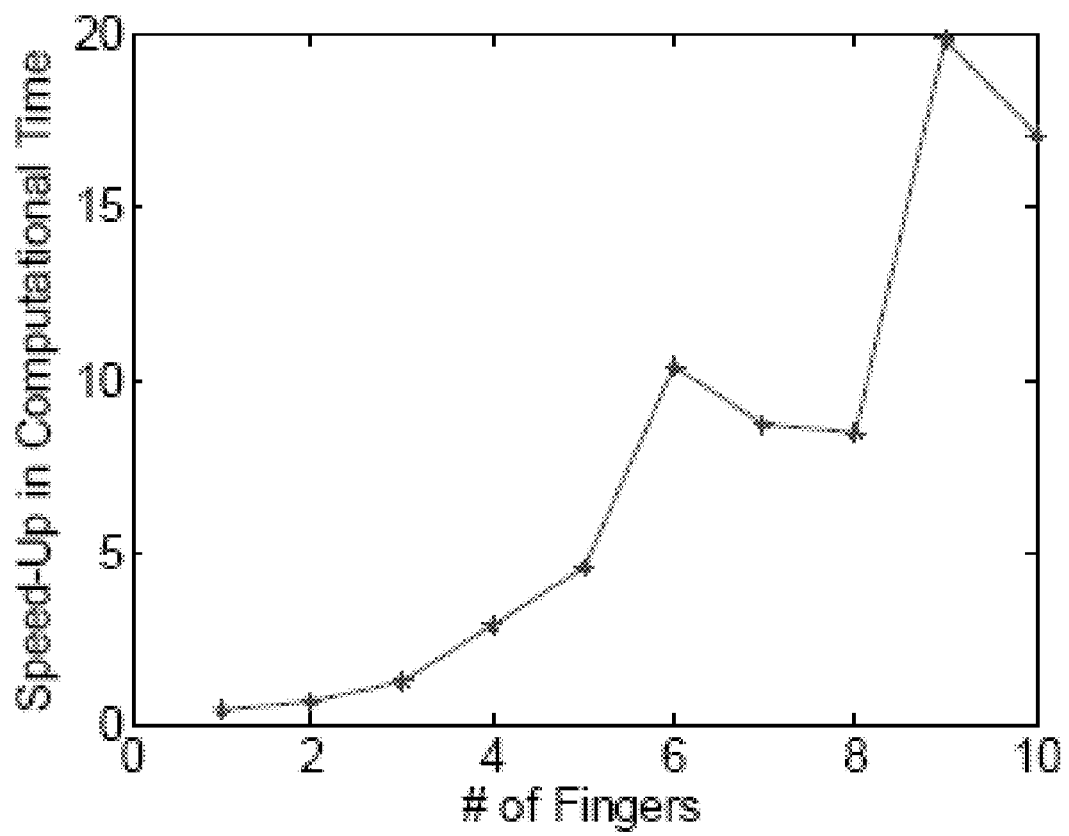
FIG. 18 depicts a graph of the speed-up in computational time for DP-MC.

As shown in FIG. 12 and FIG. 13, the step size h is adaptively controlled for the proposed dynamic programming (DP-MC) such that the estimation error of $\sigma_{MIS}$ is smaller than the given error tolerance $\epsilon=1$. FIG. 14 shows the computational time for both the proposed dynamic programming (DP-MC) and the brute-force search (BS-MC). The brute-force search enumerates all possible configurations and its complexity is close to $O(2^{2N})$. The proposed dynamic programming significantly reduces the computational cost in this example. Even if the value of N is as small as 10, the computational time is reduced from 7.5 hours (by BS-MC) to 25 minutes (by DP-MC) which is a 17× speed-up. See also FIG. 18.

The present invention describes an adaptive post-silicon tuning methodology to effectively reduce random device mismatches for analog circuits. Two tunable analog examples (i.e., a differential pair and a switched-capacitor amplifier) were discussed in detail. A DP algorithm was proposed to efficiently determine the optimal tuning configuration that yields the minimal mismatch. The proposed dynamic programming achieves significant (10~20×) speed-up compared with a brute-force search. The DP technique was further incorporated into a fast Monte Carlo analysis flow for efficient statistical analysis of the proposed tunable analog circuits. The numerical results demonstrate that if the adaptive post-silicon tuning is applied, device mismatch exponentially decreases as area increases: $\sigma \sim \exp(-\alpha \cdot \text{Area})$.

To condense and conclude the previous discussion, an exemplary sequence of steps will now be reviewed:

An exemplary method has first and second components, said first and second components disposed on a common semiconductor substrate. Each component comprises respective sub-components, each of said sub-components is disposed to be operational or non-operational under configurable control. Each component defines an operational value capable of being measured post-fabrication, the operational value being a consequence of the aggregate of the operational sub-components.

A plurality of post-fabrication measurements of the operational value for the first component is carried out, and each post-fabrication measurement carried out with respect to a respective combination of operational and non-operational sub-components thereof.

A plurality of post-fabrication measurements of the operational value for the second component is carried out, and each post-fabrication measurement carried out with respect to a respective combination of operational and non-operational sub-components thereof.

It will be appreciated that the operational value is a function of the aggregate of the sub-components that are operational at the time of the measurement.

Some particular subset of sub-components is selected for the first component, and some particular subset is selected for the second component, with the goal of optimizing some operational value, or at least causing the operational value to fall within some predetermined tolerance.

The same approach could be taken to select, for example, transistor pairs in the input section of a differential amplifier.

Exemplary operational values to be controlled or optimized might be the balance between inputs of a dual-input amplifier, the accuracy of a current through an FET as a function of input voltage, or component values.

For equipment that has been placed into operational service, it may be possible to carry out this calibration process more than once in the life of the equipment. The measurement and adjustment process may thus be carried out weeks or months or years after the initial measurement and adjustment process.

Second Embodiment

Method for Tuning Circuit Design

This embodiment discloses a method for a method for use with a circuit, the circuit comprising first and second components, said first and second components disposed on a common semiconductor substrate, said first and second components originating from the same semiconductor-fabrication process, each said component defining an operational value capable of being measured post-fabrication, each said component comprising a respective number of respective sub-components, each of said sub-components contributing a fractional portion of the operational value of the respective component, each of said sub-components disposed to be operational or non-operational under configurable control, the operational value being a consequence of the aggregate of the sub-components, the method comprising the steps of: carrying out a plurality of post-fabrication measurements of the operational value for the first component, each post-fabrication measurement carried out with respect to a respective combination of operational and non-operational sub-components thereof; carrying out a plurality of post-fabrication measurements of the operational value for the second component, each post-fabrication measurement carried out with respect to a respective combination of operational and non-operational sub-components thereof; selecting a subset of said sub-components for the first component, based upon its measured operational values; selecting a subset of said sub-components for the second component, based upon its measured operational values; and configuring said selected sub-components to render inoperable the unselected sub-components, and to render operable said selected sub-components, wherein said rendering of said sub-components as inoperable or operable is based on one or more electrical signals.

This embodiment can be further extended wherein said circuit is fabricated in silicon, the post-fabrication measurements defined as being post-silicon measurements.

This embodiment can be further extended wherein said circuit is fabricated in silicon, the post-fabrication measurements defined as being post-silicon measurements.

This embodiment can be further extended wherein said sub-components of each said component are homogeneous.

This embodiment can be further extended wherein said sub-components of each said component are in parallel with each other.

This embodiment can be further extended wherein said circuit comprises a differential amplifier defining first and second inputs, wherein the first input comprises said first component, and the second input comprises said second component, and wherein the selection of a subset of said sub-components for said first component and the selection of a subset of said sub-components for said second component are made so as to urge the amplifier toward balanced inputs.

This embodiment can be further extended wherein each said component is formed of a plurality of parallel fingers, and wherein said sub-components comprise the fingers.

This embodiment can be further extended wherein the result of the carrying-out step, the first selecting step, the second selecting step, and the configuring step, is a reduction in mismatch due to large-scale process variations.

This embodiment can be further extended wherein each said sub-component comprises a pair of transistors.

This embodiment can be further extended wherein each said sub-component comprises a pair of capacitors.

This embodiment can be further extended wherein said electrical signal is a binary signal.

This embodiment can be further extended wherein said first and second components are nano-scale components.

This embodiment can be further extended wherein said circuit is an analog, RF, or mixed-signal circuit.

Third Embodiment

Method of Use with an Analog Circuit

This embodiment discloses a method for use with a circuit, the circuit comprising a component, said component disposed on a semiconductor substrate, said component defining an operational value capable of being measured post-fabrication, said component comprising respective sub-components, said respective sub-components originating from the same semiconductor-fabrication process, each of said sub-components contributing a fractional portion of the operational value of said component, each of said sub-components disposed to be operational or non-operational under configurable control, the operational value being a consequence of the aggregate of the sub-components, the method comprising the steps of: carrying out a plurality of post-fabrication measurements of the operational value for said component; selecting a subset of said sub-components for said component, based upon its measured operational values; and configuring said selected sub-components to render inoperable the unselected sub-components, and to render operable said selected sub-components, wherein said rendering of said sub-components as inoperable or as operable is based on one or more electrical signals.

This embodiment can be extended wherein said circuit is fabricated in silicon, the post-fabrication measurements defined as being post-silicon measurements.

This embodiment can be extended wherein said sub-components of said component are homogeneous.

This embodiment can be extended wherein the sub-components of said component are in parallel with each other.

This embodiment can be extended wherein said component is formed of a plurality of parallel fingers, and wherein said sub-components comprise the fingers.

This embodiment can be extended wherein the result of the carrying-out step, the selecting step, and the configuring step, is a reduction in mismatch due to large-scale process variations.

This embodiment can be extended wherein said circuit comprises a differential amplifier defining first and second inputs, wherein one of the transistors of each pair is associated with said first input, and the other of the transistors of each pair is associated with said second input, and wherein the selection of a subset of said sub-components is made so as to urge the amplifier toward balanced inputs.

This embodiment can be extended wherein said component is a transistor.

This embodiment can be extended wherein said component is a capacitor.

This embodiment can be extended wherein said electrical signal is a binary signal.

This embodiment can be extended wherein said circuit is an analog, RF, or mixed-signal circuit.

This embodiment can be extended by further comprising the steps, carried out after the completion the steps previously set forth, of: carrying out a second plurality of post-fabrication measurements of the operational value for said component; selecting a second subset of said sub-components for said component, based upon its measured operational values, said second subset of sub-components for said component differing from the subset previously set forth; and configuring said selected sub-components to render inoperable the unselected sub-components, and to render operable said selected sub-components, based upon said second subset, wherein said rendering of said sub-components as inoperable or as operable is based on one or more electrical signals.

Fourth Embodiment

An Analog Circuit

This embodiment discloses an analog circuit, comprising: first and second components, wherein said first and second components are disposed on the same semiconductor substrate, wherein said first and second components originate from the same semiconductor fabrication process, wherein each said component comprises respective sub-components, wherein each of said sub-components is disposed to be operational or non-operational under configurable control, wherein each component define an operational value capable of being measured post-fabrication, wherein said circuit has been configured such that selected sub-components of the first component have been rendered operable and the remainder of the sub-components of the first component have been rendered inoperable, wherein said circuit has been configured such that selected sub-components of the second component have been rendered operable and the remainder of the sub-components of the second component have been rendered inoperable, and wherein said rendering of said sub-components as inoperable or as operable is based on electrical signal.

This embodiment can be further extended wherein the selection of sub-components of the first component and the selection of sub-components of the second component have been made as a function of post-fabrication measurements of an operational value for each of the components.

This embodiment can be further extended wherein the analog circuit is fabricated in silicon, the post-fabrication measurements defined as being post-silicon measurements.

This embodiment can be further extended wherein the sub-components of each component are homogeneous.

This embodiment can be further extended wherein the sub-components of each component are in parallel with each other.

This embodiment can be further extended wherein the analog circuit comprises a differential amplifier defining first and second inputs, wherein the first input comprises the first component, and the second input comprises the second component, and wherein the selection of a subset of said sub-components for the first component and the selection of a subset of said sub-components for the second component have been made so as to urge the amplifier toward balanced inputs.

This embodiment can be further extended wherein each component is formed of a plurality of parallel fingers, and wherein the sub-components comprise the fingers.

This embodiment can be further extended wherein each sub-component comprises a pair of transistors.

This embodiment can be further extended wherein each sub-component comprises a pair of capacitors.

This embodiment can be further extended wherein said electrical signal is a binary signal.

This embodiment can be further extended wherein said first and second components are nano-scale components.

Fifth Embodiment

An Analog Circuit

This embodiment discloses a circuit comprising a component, wherein said component is disposed on a semiconductor substrate, wherein said component defines an operational value capable of being measured post-fabrication, wherein said component comprises respective sub-components, wherein each of said respective sub-components originates from the same semiconductor fabrication process, wherein each of said sub-components contributes a fractional portion of the operational value of said component, the operational value being a consequence of the aggregate of said sub-components, wherein each of said sub-components is disposed to be operational or non-operational under configurable control, wherein said circuit has been configured such that selected sub-components of the component have been rendered operable and the remainder of the sub-components of the component have been rendered inoperable, and wherein said rendering of said sub-components as inoperable or as operable is based on one or more electrical signals.

This embodiment can be further extended wherein the selection of sub-components of said component has been made as a function of post-fabrication measurements of an operational value for said component.

This embodiment can be further extended wherein said circuit is fabricated in silicon, the post-fabrication measurements defined as being post-silicon measurements.

This embodiment can be further extended wherein said sub-components of said component are homogeneous.

This embodiment can be further extended wherein said sub-components of said component are in parallel with each other.

This embodiment can be further extended wherein said component is formed of a plurality of parallel fingers, and wherein said sub-components comprise the fingers.

This embodiment can be further extended wherein each said sub-component comprises a transistor.

This embodiment can be further extended wherein each said sub-component comprises a capacitor.

This embodiment can be further extended wherein said electrical signal is a binary signal.

This embodiment can be further extended wherein said circuit comprises a differential amplifier defining first and second inputs, wherein one of the transistors of each pair is associated with said first input, and the other of the transistors of each pair is associated with said second input, and wherein the selection of a subset of said sub-components is made so as to urge the amplifier toward balanced inputs.

This embodiment can be further extended wherein said circuit is an analog, RF, or mixed-signal circuit.

Obvious Variations

The proposed post-silicon methodology has been tested by numerical simulations. Current efforts are underway to design several hardware circuits, including those discussed infra, and verifying the proposed technique on silicon.

Those skilled in the art will have no difficultly devising myriad obvious variations and improvements to the invention, all of which are intended to be encompassed within the scope of the claims which follow.

What is claimed is:

1. A method for use with a circuit, the circuit comprising first and second components, said first and second components disposed on a common semiconductor substrate, said first and second components originating from the same semiconductor-fabrication process, each said component defining an operational value capable of being measured post-fabrication, each said component comprising a respective number of respective sub-components, each of said sub-components contributing a fractional portion of the operational value of the respective component, each of said sub-components disposed to be operational or non-operational under configurable control, the operational value being a consequence of the aggregate of the sub-components, the method comprising the steps of:
  carrying out a plurality of post-fabrication measurements of the operational value for the first component, each post-fabrication measurement carried out with respect to a respective combination of operational and non-operational sub-components thereof;
  carrying out a plurality of post-fabrication measurements of the operational value for the second component, each post-fabrication measurement carried out with respect to a respective combination of operational and non-operational sub-components thereof;
  selecting a subset of said sub-components for the first component, based upon its measured operational values;
  selecting a subset of said sub-components for the second component, based upon its measured operational values; and
  configuring said selected sub-components to render inoperable the unselected sub-components, and to render operable said selected sub-components,
whereby said configuration of said selected sub-components gives rise to an aggregate of sub-components, said aggregate giving rise to the operational value for the respective component of the sub-components,
wherein said rendering of said sub-components as inoperable or operable is based on one or more electrical signals, each of the electrical signals operatively connected with a respective one of the sub-components so as to select or deselect the respective one of the sub-components.

2. The method of claim 1, wherein said circuit is fabricated in silicon, the post-fabrication measurements defined as being post-silicon measurements.

3. The method of claim 1, wherein said sub-components of each said component are homogeneous.

4. The method of claim 1, wherein said sub-components of each said component are in parallel with each other.

5. The method of claim 1, wherein said circuit comprises a differential amplifier defining first and second inputs,
  wherein the first input comprises said first component, and the second input comprises said second component, and
  wherein the selection of a subset of said sub-components for said first component and the selection of a subset of said sub-components for said second component are made so as to urge the amplifier toward balanced inputs.

6. The method of claim 1, wherein each said component is formed of a plurality of parallel fingers, and wherein said sub-components comprise the fingers.

7. The method of claim 1, wherein the result of the carrying-out step, the first selecting step, the second selecting step, and the configuring step, is a reduction in mismatch due to large-scale process variations.

8. The method of claim 1, wherein each said sub-component comprises a pair of transistors.

9. The method of claim 1, wherein each said sub-component comprises a pair of capacitors.

10. The method of claim 1, wherein said electrical signal is a binary signal.

11. The method of claim 1, wherein said first and second components are nano-scale components.

12. The method of claim 1, wherein said circuit is an analog, RF, or mixed-signal circuit.

13. A method for use with a circuit, the circuit comprising a component, said component disposed on a semiconductor substrate, said component defining an operational value capable of being measured post-fabrication, said component comprising respective sub-components, said respective sub-components originating from the same semiconductor-fabrication process, each of said sub-components contributing a fractional portion of the operational value of said component, each of said sub-components disposed to be operational or non-operational under configurable control, the operational value being a consequence of the aggregate of the sub-components, the method comprising the steps of:
  carrying out a plurality of post-fabrication measurements of the operational value for said component;
  selecting a subset of said sub-components for said component, based upon its measured operational values; and
  configuring said selected sub-components to render inoperable the unselected sub-components, and to render operable said selected sub-components,
whereby said configuration of said selected sub-components gives rise to an aggregate of sub-components, said aggregate giving rise to the operational value for the respective component of the sub-components,
wherein said rendering of said sub-components as inoperable or as operable is based on one or more electrical signals, each of the electrical signals operatively connected with a respective one of the sub-components so as to select or deselect the respective one of the sub-components.

14. The method of claim 13, wherein said circuit is fabricated in silicon, the post-fabrication measurements defined as being post-silicon measurements.

15. The method of claim 13, wherein said sub-components of said component are homogeneous.

16. The method of claim 13, wherein said sub-components of said component are in parallel with each other.

17. The method of claim 13, wherein said component is formed of a plurality of parallel fingers, and wherein said sub-components comprise the fingers.

18. The method of claim 13, wherein the result of the carrying-out step, the selecting step, and the configuring step, is a reduction in mismatch due to large-scale process variations.

19. The method of claim 13, wherein said circuit comprises a differential amplifier defining first and second inputs,
  wherein one of the transistors of each pair is associated with said first input, and the other of the transistors of each pair is associated with said second input, and
  wherein the selection of a subset of said sub-components is made so as to urge the amplifier toward balanced inputs.

20. The method of claim 13, wherein said component is a transistor.

21. The method of claim 13, wherein said component is a capacitor.

22. The method of claim 13, wherein said electrical signal is a binary signal.

23. The method of claim 13, wherein said circuit is an analog, RF, or mixed-signal circuit.

24. The method of claim 13, further comprising the steps, carried out after the completion the steps previously set forth, of:
  carrying out a second plurality of post-fabrication measurements of the operational value for said component;

selecting a second subset of said sub-components for said component, based upon its measured operational values, said second subset of sub-components for said component differing from the subset previously set forth; and configuring said selected sub-components to render inoperable the unselected sub-components, and to render operable said selected sub-components, based upon said second subset, wherein said rendering of said sub-components as inoperable or as operable is based on one or more electrical signals.

25. A circuit, comprising:

first and second components, wherein said first and second components are disposed on a common semiconductor substrate, wherein said first and second components originate from the same semiconductor fabrication process, wherein each component defines an operational value capable of being measured post-fabrication, wherein each said component comprises respective sub-components, wherein each of said sub-components contributes a fractional portion of the operational value of the respective component, the operational value being a consequence of the aggregate of said sub-components, wherein each of said sub-components is disposed to be operational or non-operational under configurable control, wherein said circuit has been configured such that selected sub-components of the first component have been rendered operable and the remainder of the sub-components of the first component have been rendered inoperable, wherein said circuit has been configured such that selected sub-components of the second component have been rendered operable and the remainder of the sub-components of the second component have been rendered inoperable, and whereby said configuration of said selected sub-components gives rise to an aggregate of sub-components, said aggregate giving rise to the operational value for the respective component of the sub-components, wherein said rendering of said sub-components as inoperable or as operable is based on one or more electrical signals, each of the electrical signals operatively connected with a respective one of the sub-components so as to select or deselect the respective one of the sub-components.

26. The circuit of claim 25, wherein the selection of sub-components of said first component and the selection of sub-components of said second component have been made as a function of post-fabrication measurements of an operational value for each of said components.

27. The circuit of claim 25, wherein said circuit is fabricated in silicon, the post-fabrication measurements defined as being post-silicon measurements.

28. The circuit of claim 25, wherein said sub-components of each said component are homogeneous.

29. The circuit of claim 25, wherein said sub-components of each said component are in parallel with each other.

30. The circuit of claim 25, wherein said circuit comprises a differential amplifier defining first and second inputs, wherein said first input comprises the first component, and said second input comprises the second component, and wherein the selection of a subset of said sub-components for said first component and the selection of a subset of said sub-components for said second component have been made so as to urge the amplifier toward balanced inputs.

31. The circuit of claim 25, wherein each said component is formed of a plurality of parallel fingers, and wherein said sub-components comprise the fingers.

32. The circuit of claim 25, wherein each said sub-component comprises a pair of transistors.

33. The circuit of claim 25, wherein each said sub-component comprises a pair of capacitors.

34. The circuit of claim 25, wherein said electrical signal is a binary signal.

35. The circuit of claim 25, wherein said first and second components are nano-scale components.

36. The circuit of claim 25, wherein said circuit is an analog, RF, or mixed-signal circuit.

37. A circuit comprising a component, wherein said component is disposed on a semiconductor substrate, wherein said component defines an operational value capable of being measured post-fabrication, wherein said component comprises respective sub-components, wherein each of said respective sub-components originates from the same semiconductor fabrication process, wherein each of said sub-components contributes a fractional portion of the operational value of said component, the operational value being a consequence of the aggregate of said sub-components, wherein each of said sub-components is disposed to be operational or non-operational under configurable control, wherein said circuit has been configured such that selected sub-components of the component have been rendered operable and the remainder of the sub-components of the component have been rendered inoperable, and whereby said configuration of said selected sub-components gives rise to an aggregate of sub-components, said aggregate giving rise to the operational value for the respective component of the sub-components, wherein said rendering of said sub-components as inoperable or as operable is based on one or more electrical signals, each of the electrical signals operatively connected with a respective one of the sub-components so as to select or deselect the respective one of the sub-components.

38. The circuit of claim 37, wherein the selection of sub-components of said component has been made as a function of post-fabrication measurements of an operational value for said component.

39. The circuit of claim 37, wherein said circuit is fabricated in silicon, the post-fabrication measurements defined as being post-silicon measurements.

40. The circuit of claim 37, wherein said sub-components of said component are homogeneous.

41. The circuit of claim 37, wherein said sub-components of said component are in parallel with each other.

42. The circuit of claim 37, wherein said component is formed of a plurality of parallel fingers, and wherein said sub-components comprise the fingers.

43. The circuit of claim 37, wherein each said sub-component comprises a transistor.

44. The circuit of claim 37, wherein each said sub-component comprises a capacitor.

45. The circuit of claim 37, wherein said electrical signal is a binary signal.

46. The circuit of claim 37, wherein said circuit comprises a differential amplifier defining first and second inputs, wherein one of the transistors of each pair is associated with said first input, and the other of the transistors of each pair is associated with said second input, and wherein the selection of a subset of said sub-components is made so as to urge the amplifier toward balanced inputs.

47. The circuit of claim 37, wherein said circuit is an analog, RF, or mixed-signal circuit.

* * * * *